(12) United States Patent
Hiramatsu et al.

(10) Patent No.: US 11,870,421 B2
(45) Date of Patent: Jan. 9, 2024

(54) SURFACE ACOUSTIC WAVE RESONATOR WITH SUPPRESSED TRANSVERSE MODES USING SECOND BUS BAR

(71) Applicant: SKYWORKS SOLUTIONS, INC., Irvine, CA (US)

(72) Inventors: Yuya Hiramatsu, Neyagawa (JP); Rei Goto, Osaka (JP); Yumi Torazawa, Takatsuki (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 429 days.

(21) Appl. No.: 17/076,945

(22) Filed: Oct. 22, 2020

(65) Prior Publication Data

US 2021/0126618 A1    Apr. 29, 2021

Related U.S. Application Data

(60) Provisional application No. 62/924,771, filed on Oct. 23, 2019.

(51) Int. Cl.
*H03H 9/25*     (2006.01)
*H03H 9/02*     (2006.01)
*H03H 9/72*     (2006.01)
*H03H 9/64*     (2006.01)
*H03H 9/145*    (2006.01)

(52) U.S. Cl.
CPC .......... *H03H 9/25* (2013.01); *H03H 9/02559* (2013.01); *H03H 9/02834* (2013.01); *H03H 9/14541* (2013.01); *H03H 9/6483* (2013.01); *H03H 9/725* (2013.01)

(58) Field of Classification Search
CPC ...... H03H 9/25; H03H 9/02559; H03H 9/145; H03H 9/64; H03H 9/72
See application file for complete search history.

(56) References Cited

U.S. PATENT DOCUMENTS

| | | | |
|---|---|---|---|
| 7,965,155 B2 | 6/2011 | Nakamura et al. | |
| 9,035,725 B2* | 5/2015 | Komatsu ............ | H03H 9/02858 333/193 |
| 9,257,960 B2 | 2/2016 | Ruile et al. | |
| 9,640,750 B2* | 5/2017 | Nakanishi .......... | H03H 9/02559 |
| 9,998,092 B2 | 6/2018 | Taniguchi | |
| 10,673,410 B2* | 6/2020 | Shoda .................. | H03H 9/0009 |
| 11,496,116 B2* | 11/2022 | Takata ............... | H03H 9/02992 |

* cited by examiner

*Primary Examiner* — Andrea Lindgren Baltzell
*Assistant Examiner* — Alan Wong
(74) *Attorney, Agent, or Firm* — Lando & Anastasi, LLP

(57) ABSTRACT

Aspects of this disclosure relate to a surface acoustic wave resonator. The surface acoustic wave resonator includes a piezoelectric substrate, interdigital transducer electrodes disposed on an upper surface of the piezoelectric substrate, a dielectric temperature compensation layer disposed on the piezoelectric substrate to cover the interdigital transducer electrodes, and a dielectric passivation layer over the temperature compensation layer. The passivation layer may include an oxide layer configured to have a sound velocity greater than that of the temperature compensation layer to suppress a transverse signal transmission.

20 Claims, 16 Drawing Sheets

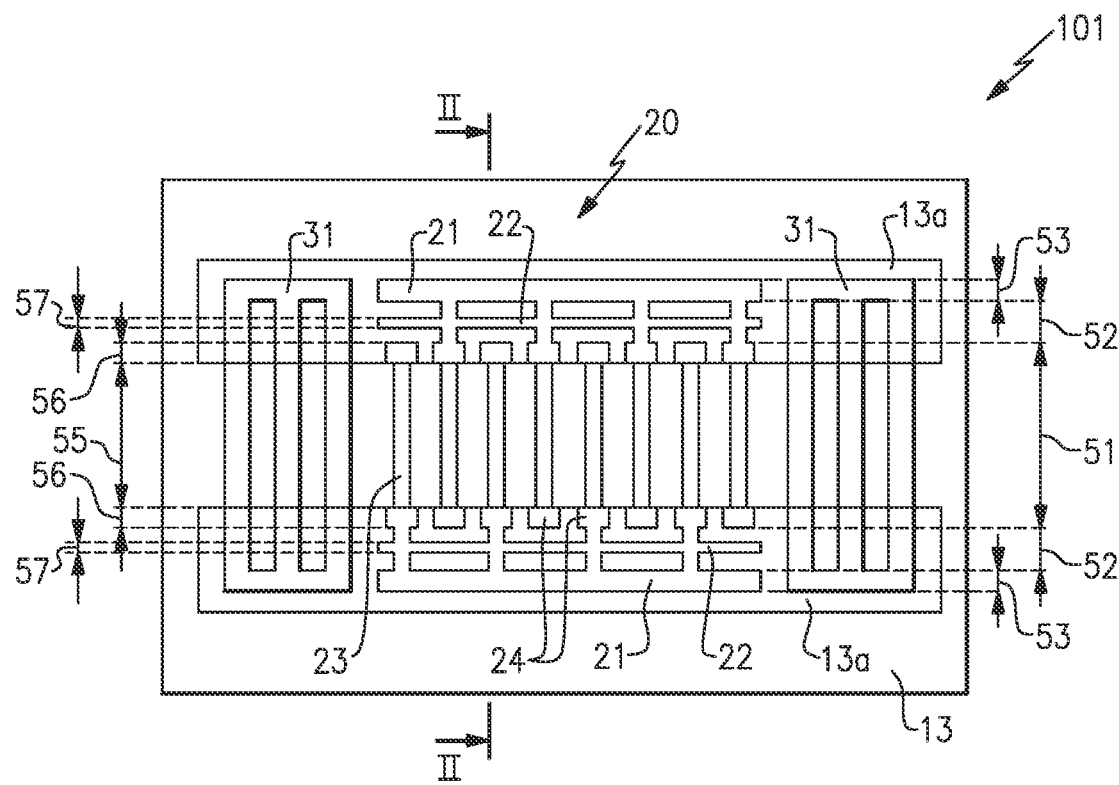
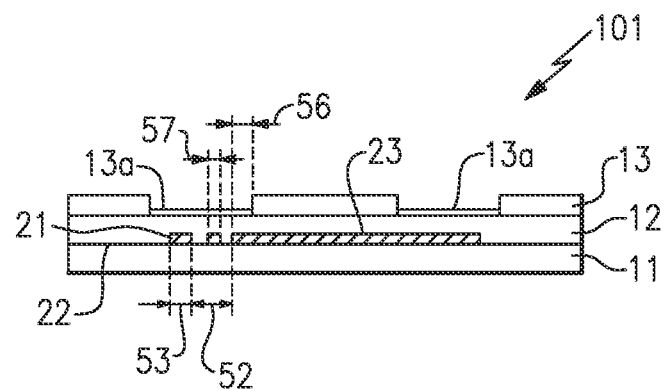

SURFACE ACOUSTIC WAVE RESONATOR WITH SUPPRESSED TRANSVERSE MODES USING SECOND BUS BAR

CROSS-REFERENCE TO RELATED APPLICATIONS

The present application claims priority under 35 U.S.C. § 119(e) to U.S. Provisional Patent Application Ser. No. 62/924,771, titled SURFACE ACOUSTIC WAVE RESONATOR WITH SUPPRESSED TRANSVERSE MODES USING SECOND BUS BAR, filed Oct. 23, 2019, the entire contents of which being incorporated by reference herein for all purposes.

BACKGROUND

Technical Field

Embodiments of this disclosure relate to surface acoustic wave (SAW) resonators, and to filters, duplexers, and wireless devices using same.

Description of Related Technology

Surface acoustic wave (SAW) resonators may be used in filters, duplexers, and the like included in wireless devices for mobile communication. In one example, a SAW resonator includes a substrate that is formed of rotated Y-cut lithium niobate ($LiNbO_3$) with a lower cut angle ranging from, for example, −20 to 30 degrees, and a silicon dioxide ($SiO_2$) film disposed on an upper surface of the substrate for temperature compensation.

FIG. 1A is a top view illustrating an electrode arrangement in an example of a SAW resonator 110 and FIG. 1B is a cross sectional view taken along line I-I shown in FIG. 1A. In the SAW resonator 110, interdigital transducer (IDT) electrodes 20 are disposed on an upper surface of a rotated Y-cut $LiNbO_3$ substrate 11 with a cut angle of 5 degrees. The IDT electrodes 20 include aluminum (Al) deposited on molybdenum (Mo). A silicon dioxide ($SiO_2$) film 12 is disposed on the substrate 11 to cover the IDT electrodes 20. It should be appreciated that a protection layer of silicon nitride (SiN) 13 can be further disposed on the $SiO_2$ film 12 as illustrated in FIG. 1C.

The IDT electrodes 20 include bus bar electrode regions 53, an overlapping region 51, and gap regions 52 in the transverse direction perpendicular to the propagation direction of surface acoustic waves excited by the IDT electrodes 20. In the bus bar electrode regions 53, a pair of bus bar electrodes 21 extend opposing each other in the propagation direction. In the overlapping region 51, electrode fingers 23 extending from one bus bar electrode 21 toward the opposite bus bar electrode 21 alternately overlap with each other. Each of the gap regions 52 includes gaps formed between a bus bar electrode 21 and opposing tips of the electrode fingers 23 extending from the other bus bar electrode 21. A pair of reflector electrodes 31 are formed to sandwich the IDT electrodes 20 in the propagation direction. The transverse direction perpendicular to the propagation direction of the surface acoustic waves may be referred to merely as the transverse direction herein.

In a SAW resonator having such a configuration, high-order transverse mode spurious signals can be generated in a frequency band between a resonance frequency and an anti-resonance frequency of the SAW resonator. Various techniques have been used in an attempt to suppress the high-order transverse mode spurious signals and reduce the degradation in the operating characteristics of the SAW resonator. According to one technique, apodized IDT electrodes may be formed of Al or the like on a lower-cut angle rotated Y-cut $LiNbO_3$ substrate and a dielectric film covering the IDT electrodes may be provided with non-formation region at a portion in the transverse direction. According to another technique, a recess may be provided at a portion in the transverse direction on a dielectric film covering IDT electrodes on a rotated Y-cut $LiNbO_3$ substrate with a cut angle ranging from 125 to 131 degrees. According to another technique, electrode fingers 23 of IDT electrodes 20 may be formed with a greater width at a portion in the transverse direction.

SUMMARY

Suppression of high-order transverse mode spurious signals and ensuring a satisfactory quality factor (Q) have been challenging in a SAW resonator in which a heavier electrode including, for example, Mo for ensuring high electromechanical coupling is disposed on a lower-cut-degree rotated Y-cut $LiNbO_3$ substrate and the electrode and the substrate are covered with a $SiO_2$ film for temperature compensation.

Aspects of this disclosure include a surface acoustic wave resonator including a piezoelectric substrate, interdigital transducer electrodes disposed on an upper surface of the piezoelectric substrate, a first dielectric film for temperature compensation covering the interdigital transducer electrodes and the piezoelectric substrate, and a second dielectric film covering the first dielectric film, in which the interdigital transducer electrodes include first bus bar electrode regions, an overlapping region sandwiched between the first bus bar electrode regions, and gap regions defined between the respective first bus bar electrode regions and the overlapping region in a transverse direction perpendicular to a propagation direction of a surface acoustic wave to be excited. Each of the gap regions may include a second bus bar electrode in parallel to a respective first bus bar electrode.

In some embodiments, the second dielectric film includes a trench having a portion corresponding to the gap region and a respective first bus bar electrode region that is thinner than a portion corresponding to the overlapping region.

In some embodiments, the surface acoustic wave resonator further comprises a hammer head electrode formed across a certain distance from a respective gap region in the transverse direction by extending a width of an electrode finger within the overlapping region in the propagation direction.

The second bus bar electrode may extend intermittently. The first dielectric film may be formed of $SiO_2$. The second dielectric film may be formed of SiN.

An intermediate layer formed of silicon oxynitride may be disposed between the first dielectric film and the second dielectric film.

The piezoelectric substrate may be formed of rotated Y-cut lithium niobate with a cut angle ranging from −20 to 30 degrees. The interdigital transducer electrodes may include molybdenum. The interdigital transducer electrodes may include aluminum deposited on molybdenum.

Aspects of this disclosure include a filter including a surface acoustic wave resonator as disclosed herein. The filter may be configured as a receive filter. The surface acoustic wave resonator disposed between an output node and a ground for matching. The filter may be a ladder filter. The filter may be a longitudinal mode filter.

Aspects of this disclosure provide a duplexer including a transmit filter and a receive filter, in which a surface acoustic wave filter according to an embodiment of this disclosure is used as at least one of the transmit filter and the receive filter.

Aspects of this disclosure include a wireless device that communicates by a frequency division bidirectional communication at a radio frequency and includes a duplexer according to an embodiment of this disclosure.

In accordance with another aspect, there is provided a filter including a surface acoustic wave resonator. The surface acoustic wave resonator comprises a piezoelectric substrate, interdigital transducer electrodes disposed on an upper surface of the piezoelectric substrate, the interdigital transducer electrodes including first bus bar electrode regions spaced apart from each other in a transverse direction perpendicular to a propagation direction of a surface acoustic wave to be excited, an overlapping region sandwiched between the first bus bar electrode regions, and gap regions defined between the respective first bus bar electrode regions and the overlapping region in the transverse direction, each of the gap regions including a second bus bar electrode disposed in parallel to a respective first bus bar electrode, reflector electrodes disposed on opposite sides of the interdigital transducer electrodes and displaced from the interdigital transducer electrodes in the propagation direction of the surface acoustic wave to be excited, a first dielectric film covering the interdigital transducer electrodes and the upper surface of the piezoelectric substrate for temperature compensation, and a second dielectric film covering the first dielectric film, the second dielectric film including a trench having portions defined within the gap regions, within the first bus bar electrode regions, and over portions of the reflector electrodes.

In accordance with another aspect, there is provided a wireless device that communicates by a frequency division bidirectional communication at a radio frequency, the wireless device having a duplexer with a transmit filter and a receive filter, at least one of the transmit filter and the receive filter including a surface acoustic wave resonator. The surface acoustic wave resonator includes a piezoelectric substrate, interdigital transducer electrodes disposed on an upper surface of the piezoelectric substrate, the interdigital transducer electrodes including first bus bar electrode regions spaced apart from each other in a transverse direction perpendicular to a propagation direction of a surface acoustic wave to be excited, an overlapping region sandwiched between the first bus bar electrode regions, and gap regions defined between the respective first bus bar electrode regions and the overlapping region in the transverse direction, each of the gap regions including a second bus bar electrode disposed in parallel to a respective first bus bar electrode, a first dielectric film covering the interdigital transducer electrodes and the upper surface of the piezoelectric substrate for temperature compensation, and a second dielectric film covering the first dielectric film, the second dielectric film including a trench having portions defined within the gap regions, within the first bus bar electrode regions, and within regions on opposite sides of the first bus bar electrode regions from the overlapping region.

BRIEF DESCRIPTION OF THE DRAWINGS

Embodiments of this disclosure will now be described, by way of non-limiting example, with reference to the accompanying drawings.

FIG. 2A is a top view illustrating an electrode arrangement in a SAW resonator according to an embodiment of the present disclosure;

FIG. 2B is a cross sectional view of a SAW resonator according to an embodiment of the present disclosure;

DETAILED DESCRIPTION

Figure 1A:
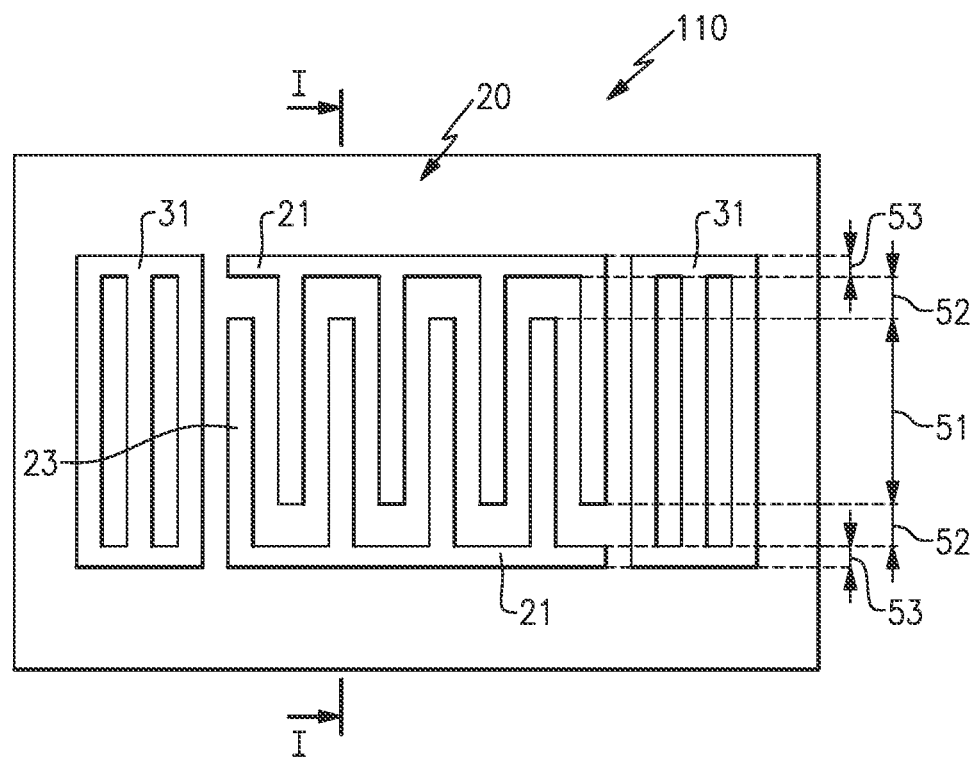
FIG. 1A is a top view illustrating an electrode arrangement in an example of a surface acoustic wave (SAW) resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. Aspects of this disclosure relate to a surface acoustic wave (SAW) resonator, and a filter, a duplexer, and a wireless device including the SAW resonator. In embodiments discussed herein, the downlink frequency ranging from 729 to 746 megahertz (MHz) of Band 12 according to the long term evolution (LTE) standard may be exemplified for a frequency division bidirectional communication for mobile communications; however, the teachings described herein can be applied to other standards and frequency bands.

FIG. 2A is a top view illustrating an electrode arrangement in a surface acoustic wave (SAW) resonator 101 and FIG. 2B is a cross sectional view taken along line II-II shown in FIG. 2A.

The SAW resonator 101 includes a piezoelectric substrate 11 having a certain thickness and formed of rotated Y-cut lithium niobate (LiNbO$_3$) with a cut angle of 5 degrees, interdigital transducer (IDT) electrodes 20 disposed on an upper surface of the substrate 11 to excite a SAW, and a pair of reflector electrodes 31 disposed thereon to sandwich the IDT electrodes in the propagation direction of the SAW. The IDT electrodes 20 and the reflector electrodes 31 include a heavier element such as molybdenum (Mo) to ensure a desired degree of electromechanical coupling with the substrate 11 and aluminum (Al) deposited on the Mo base to ensure a desired level of electrical conductivity. Further, a silicon dioxide (SiO$_2$) film 12 as a first dielectric film having a certain thickness for temperature compensation is disposed on the upper surface of the substrate 11 and covers the IDT electrodes 20 and the reflector electrodes 31. A silicon nitride (SiN) film 13 as a second dielectric film having a certain thickness for protection is disposed on an upper surface of the SiO$_2$ film 12.

The heavy metal forming the IDT electrodes 20 may not only include Mo but also copper (Cu), silver (Ag), gold (Au), tungsten (W), tantalum (Ta), and the like. Further, these heavy metals can be combined with Al deposited thereon. In the IDT electrodes 20, the heavy metal as an upper layer may be deposited on Al as a lower layer, or Al as an upper layer may be deposited on the heavy metal as a lower layer.

The rotated Y-cut with a cut angle of 5 degrees for the LiNbO$_3$ substrate 11 can be expressed as (0°, 5°-90°, 0°) using the Euler angles ($\varphi$, $\theta$, $\psi$). The cut angle of the rotated Y-cut LiNbO$_3$ substrate 11 may not be only 5 degrees but may alternatively be lower cut angles ranging from −20 to 30 degrees. These lower cut angles may be expressed as (0°, −20°-90° to 30°-90°, 0°) using the Euler angles ($\varphi$, $\theta$, $\psi$). Here, although the rotated Y-cut with a cut angle of $\alpha$ can be expressed as (0°, $\alpha$−90°, 0°) using the Euler angles ($\varphi$, $\theta$, $\psi$), the Euler angles (0°, $\alpha$+90°, 0°) may also provide the same properties. As described herein, the former expression (0°, $\alpha$−90°, 0°) is to be used.

The IDT electrodes 20 disposed on the upper surface of the substrate 11 include bus bar electrode regions 53 (first bus bar electrode regions), gap regions 52, and an overlapping region 51 in a transverse direction perpendicular to the propagation direction of a SAW through the resonator 101 (hereinafter referred merely to the "transverse direction"). In the bus bar electrode regions 53 opposing each other, a pair of bus bar electrodes 21 as first bus bar electrodes are formed spaced apart from each other with a certain distance. In the overlapping region 51, electrode fingers 23 each having a certain width alternately extend between one bus bar electrode region 53 and the opposite bus bar electrode region 53 with a certain pitch in the propagation direction. Each of the gap regions 52 includes a gap between one bus bar electrode 21 and opposing tips of the electrode fingers 23 extending from the other bus bar electrode 21, i.e., between a respective bus bar electrode region 53 and the overlapping region 51.

In the SAW resonator 101, the SiN film 13 has a greater thickness in a center region 55 within the overlapping region 51 in the transverse direction than in other regions within the overlapping region 51. Specifically, the SiN film 13 disposed on the upper surface of the SiO$_2$ film 12 includes trenches 13a opposing each other in the transverse direction. Each trench 13a is formed by portions of the SiN film 13 recessed to a certain depth in a portion within the overlapping region 51 excluding the center region 55, in a respective gap regions 52, and in a respective bus bar electrode region 53. The thickness of the SiN film 13 in the center region 55 is greater than the thickness of the SiN film 13 in respective trenches 13a adjacent to the center region 55.

Further, in the SAW resonator 101, the IDT electrodes 20 includes second bus bar electrode regions 57 spaced apart from each other in the transverse direction. Each of the second bus bar electrode regions 57 includes a second bus bar electrode 22 formed within a respective gap region 52 in parallel to the first bus bar electrode 21. The second bus bar electrode 22 is formed to have a width less than that of the first bus bar electrode 21. The second bus bar electrode 22 can be referred to as a mini bus bar electrode 22.

Further, in the SAW resonator 101, the IDT electrodes 20 include hammer head electrode regions 56 corresponding to respective tips of the electrode fingers 23 within the overlapping region 51. Each of the hammer head electrode regions 56 includes hammer head electrodes 24, each of which is formed by extending the width of an electrode finger 23 to be shaped like a hammer head across a certain distance extending from the interface of the tip of the electrode finger 23 with a respective gap region 52 to the center region 55 in the transverse direction.

Figure 3:
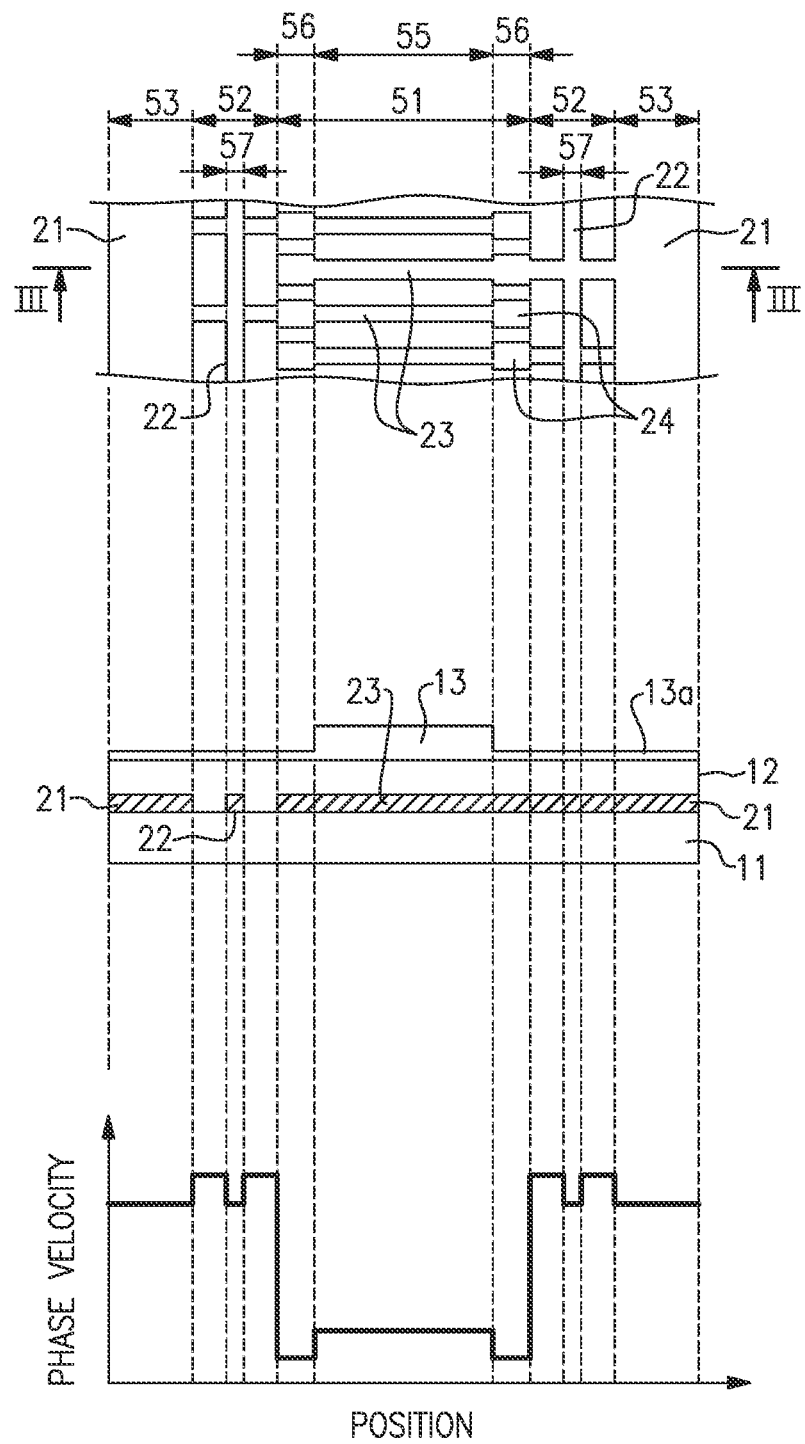
FIG. 3 illustrates a phase velocity distribution in the transverse direction of a SAW resonator according to an embodiment along with the top view and cross-sectional view thereof.

FIG. 3 illustrates a phase velocity distribution in the transverse direction of the SAW resonator 101 along with a top view and a cross-sectional view of the SAW resonator 101. The phase velocity distribution illustrated in the lower section of FIG. 3 corresponds to a portion of the upper surface of the SAW resonator 101 illustrated in the upper section of FIG. 3, and also to the cross-section of the SAW resonator 101 illustrated in the middle section of FIG. 3. The middle section of FIG. 3 illustrates a cross-section taken along line III-III in the upper section of FIG. 3.

As illustrated in the lower section of FIG. 3 indicating the transverse direction distribution of the phase velocity, the phase velocity of the overlapping region 51 is lower than the phase velocities of the gap regions 52 and the bus bar electrode regions 53, both of which are disposed laterally outside from the overlapping region 51 in opposite directions, and thus a well-like recess having a bottom at the overlapping region 51 is formed. In the overlapping region 51 including the well-like recess in the phase velocity distribution, the phase velocity of the center region 55 having the SiN film 13 thicker than in the hammer head electrode regions 56 disposed laterally outside from the center region 55 may be greater than the phase velocity of the hammer head electrode regions 56 each including a trench 13*a*. Further, comparing the phase velocities of the gap regions 52 and the bus bar electrode regions 53, the phase velocity of the gap regions 52 may be greater than the phase velocity of the bus bar electrode regions 53 except for in the mini bus bar electrode regions 57. The phase velocity of the mini bus bar electrode regions 57 within the gap regions 52 may be at the same level as the phase velocity of the bus bar electrode regions 53.

The SAW resonator 101 is configured, in the transverse direction, to have the structure of trenches 13*a*, which may realize a greater thickness of the SiN film 13 in the center region 55, the structure of mini bus bar electrodes 22 in the mini bus bar electrode regions 57 within the gap regions 52, the structure of hammer head electrodes 24 allowing the width of the electrode fingers 23 to be partially enlarged in the hammer head electrode regions 56. Accordingly, the phase velocity distribution in the transverse direction may be achieved as indicated in the lower section of FIG. 3. Such a phase velocity distribution in the transverse direction can form a piston mode that may allow the oscillation energy to be confined within the center region 55 such that the SAW energy distribution can be substantially constant and piston-like therewithin. This may suppress the occurrence of a high-order transverse mode.

Figure 1B:
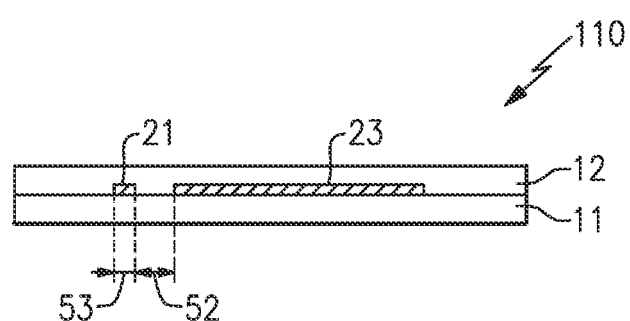
FIG. 1B is a cross-sectional view of the surface acoustic wave resonator of FIG. 1A.
Figure 4A:
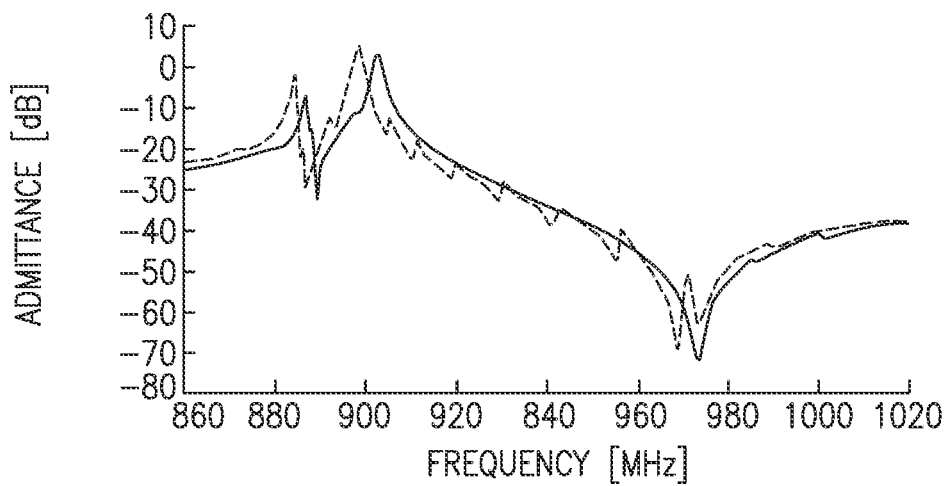
FIG. 4A is a graph illustrating admittance characteristics of a SAW resonator according to an embodiment of the present disclosure.
Figure 4B:
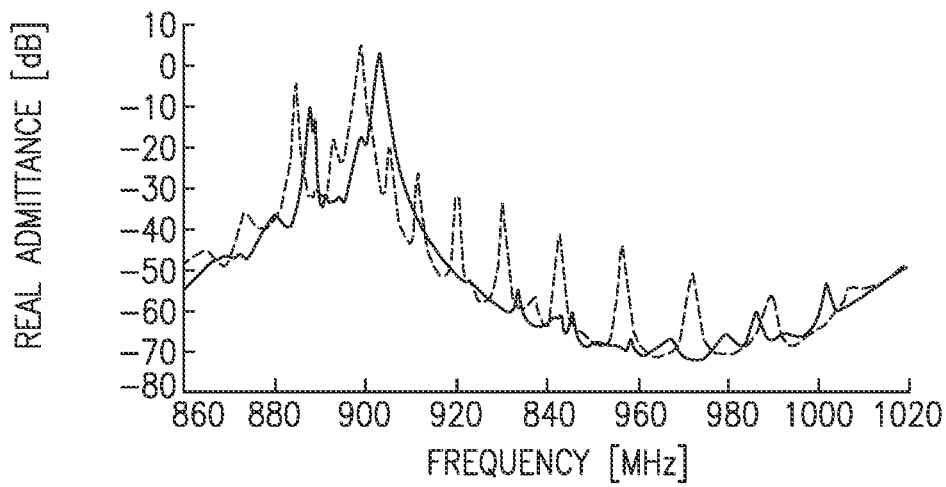
FIG. 4B is a graph illustrating the real part of admittance characteristics of a SAW resonator according to an embodiment of the present disclosure.
Figure 4C:
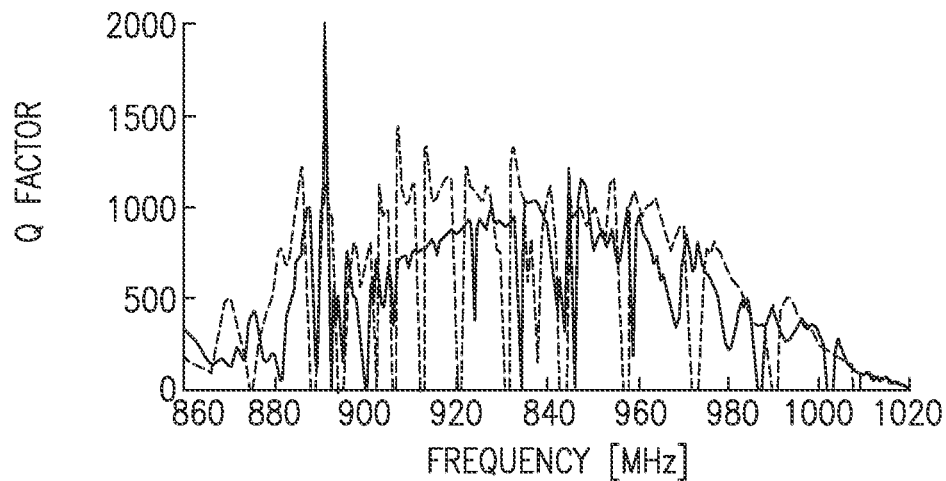
FIG. 4C is a graph illustrating a quality factor (Q) of a SAW resonator according to an embodiment of the present disclosure.

FIGS. 4A, 4B, and 4C illustrate curves of admittance characteristic, the real part of the admittance characteristic, and the quality factor (Q) of the SAW resonator 101, respectively, in solid lines. In FIGS. 4A to 4C, the characteristics of the SAW resonator 110, which is discussed referring to FIGS. 1A and 1B, are also indicated by dashed lines for comparison.

As illustrated in FIG. 4B, some spurious responses can be found in the real part of the admittance characteristic of the SAW resonator 110 indicated by the dashed line within a frequency band corresponding to the transition between the resonance and the antiresonance frequencies in the admittance characteristic of FIG. 4A. On the other hand, as can be seen in the corresponding curve of the SAW resonator 101 indicated by the solid line, such spurious responses are suppressed.

Such a suppression of spurious responses in the SAW resonator 101 may be achieved by the structures of the trenches 13*a*, the mini bus bar electrodes 22, and the hammer head electrodes 24 as described above. Such structures may allow the energy distribution in the transverse direction of the SAW to be confined within the center region 55 in a piston mode and may suppress the high-order transverse mode spuriousness.

In FIG. 4C, the Q factor distribution of the SAW resonator 101 indicated by the solid line is lowered from that of the SAW resonator 110 indicated by the dashed line but the difference is relatively small such that a certain Q factor can be ensured for the SAW resonator 101. In the SAW resonator 101, suppression of the high-order transverse mode spurious responses can be achieved while a certain Q factor can be ensured. Thus, the SAW resonator 101 can ensure better operating characteristics than the SAW resonator 110.

Figure 5A:
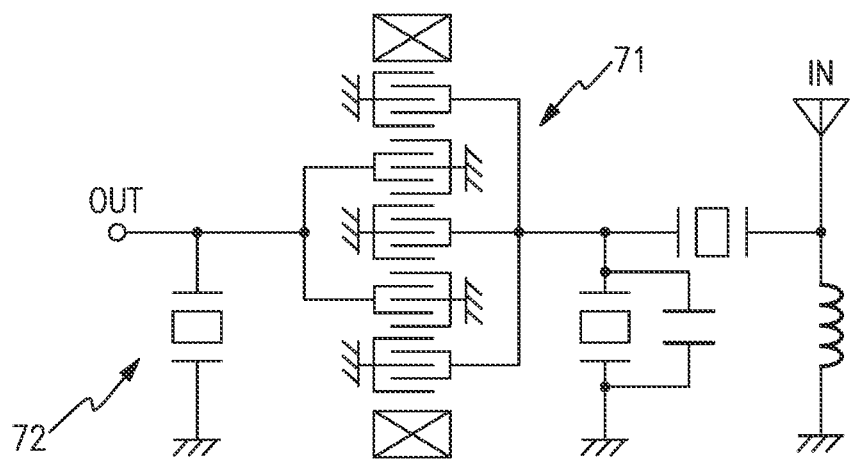
FIG. 5A illustrates a circuit diagram of a receive filter.
Figure 5B:
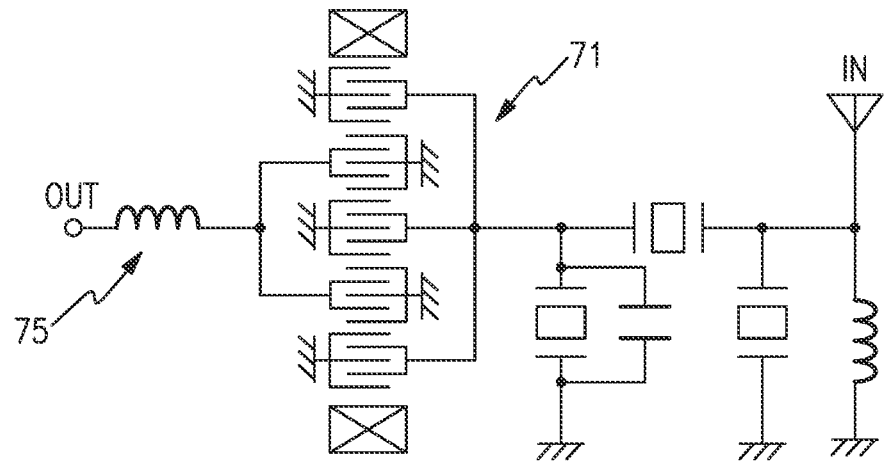
FIG. 5B illustrates a circuit diagram of another receive filter.

FIG. 5A illustrates a circuit diagram of a receive filter to which a SAW resonator 72 is applied at an output node for matching. FIG. 5B illustrates a comparative circuit diagram of a receive filter in which a series inductor 75 is disposed at the output node. These receive filters can be used for the downlink frequency ranging from 729 to 746 MHz of Band 12 according to the long term evolution (LTE) standard.

The receive filter illustrated in FIG. 5A includes a ladder SAW filter 71 and the SAW resonator 72 is disposed between the output node and the ground. The receive filter of FIG. 5B is substantially similar to the receive filter of FIG. 5A except that the receive filter of FIG. 5B includes the series inductor 75 between the SAW filter 71 and the output node instead of the SAW resonator 72 included in the receive filter of FIG. 5A.

Figure 6:
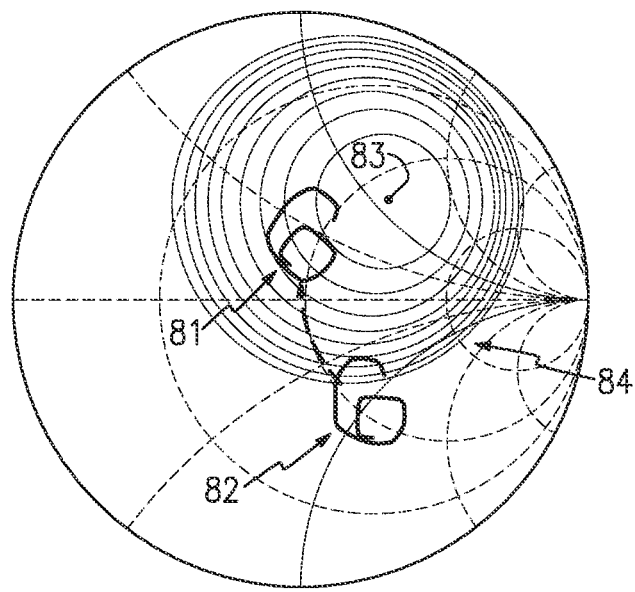
FIG. 6 is a Smith chart illustrating how the series inductor included in the receive filter of FIG. 5B operates.

FIG. 6 is a Smith chart illustrating how the series inductor 75 included in the receive filter of FIG. 5B operates. The Smith chart of FIG. 6 indicates an output impedance trajectory 81 for the receive filter of FIG. 5B and an output impedance trajectory 82 when the SAW filter 71 is directly connected to the output node without the series inductor 75 in the frequency band of the downlink frequency ranging from 729 to 746 MHz of Band 12 according to the LTE standard.

Further, the Smith chart of FIG. 6 indicates an optimal output impedance value 83 of the receive filter for minimizing the noise figure of a next-stage low noise amplifier in the receive filter, and substantially concentric areas 84 centered at the optimal output impedance value 83 for stepwisely showing the correspondence to noise figures ranging from the minimum value to a certain value with reference to the optimal output impedance value 83. The optimal output impedance value 83 may be a positive value on the imaginary part of the output impedance. When the series inductor 75 is removed from the receive filter of FIG. 5B, the imaginary part of the output impedance is a negative value and a mismatch occurs to result in the degradation of the noise figure.

As illustrated in FIG. 6, the series inductor 75 of the receive filter of FIG. 5B may operate to move the output impedance trajectory 82 whose imaginary part would be a negative value without the series inductor 75 to the output impedance trajectory 81 whose imaginary part is a positive value. The operation of such a series inductor 75 can allow the output impedance trajectory 81 of the receive filter of FIG. 5B to be included in the concentric areas 84 centered at the optimal output impedance value 83 such that the noise factor of the next-stage low noise amplifier may be ensured to be within an certain range from the minimum value. On the contrary, in the receive filter of FIG. 5B, the series inductor 75 may have a resistive component that degrades the noise factor of the next-stage low noise amplifier.

Figure 7:
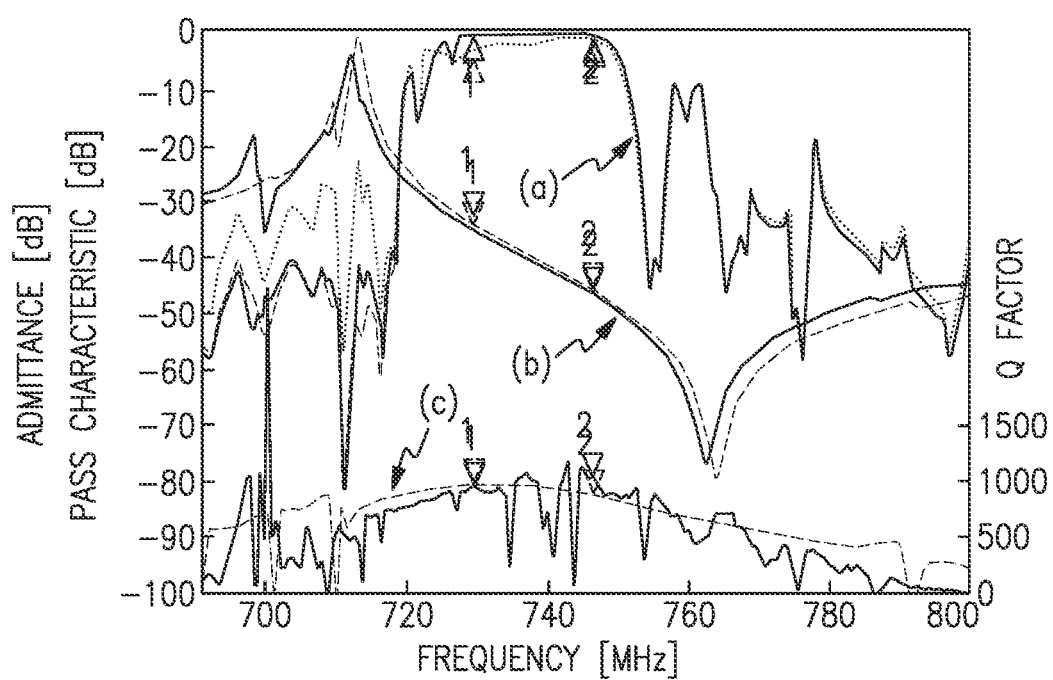
FIG. 7 is a graph illustrating characteristics when a SAW resonator of an embodiment is applied to the receive filter of FIG. 5A.

FIG. 7 is a graph illustrating characteristics of the receive filter including the SAW resonator 72 illustrated in FIG. 5A when the SAW resonator 101 illustrated in FIGS. 2A and 2B is used as the SAW resonator 72.

In FIG. 7, curves (a) indicate pass characteristics of the receive filter in which a solid line indicates the case where the SAW resonator 72 is provided, a dashed line indicates the case where an ideal matching resonator is provided instead of the SAW resonator 72, and a dotted line indicates the case where there is no resonator provided at the output node.

Curves (b) in FIG. 7 include a solid line indicating an admittance characteristic of the SAW resonator 72 and a dashed line indicating an admittance characteristic of an ideal matching resonator. Curves (c) include a solid line indicating a Q factor of the SAW resonator 72 and a dashed line indicating a Q factor of an ideal matching resonator.

Figure 8:
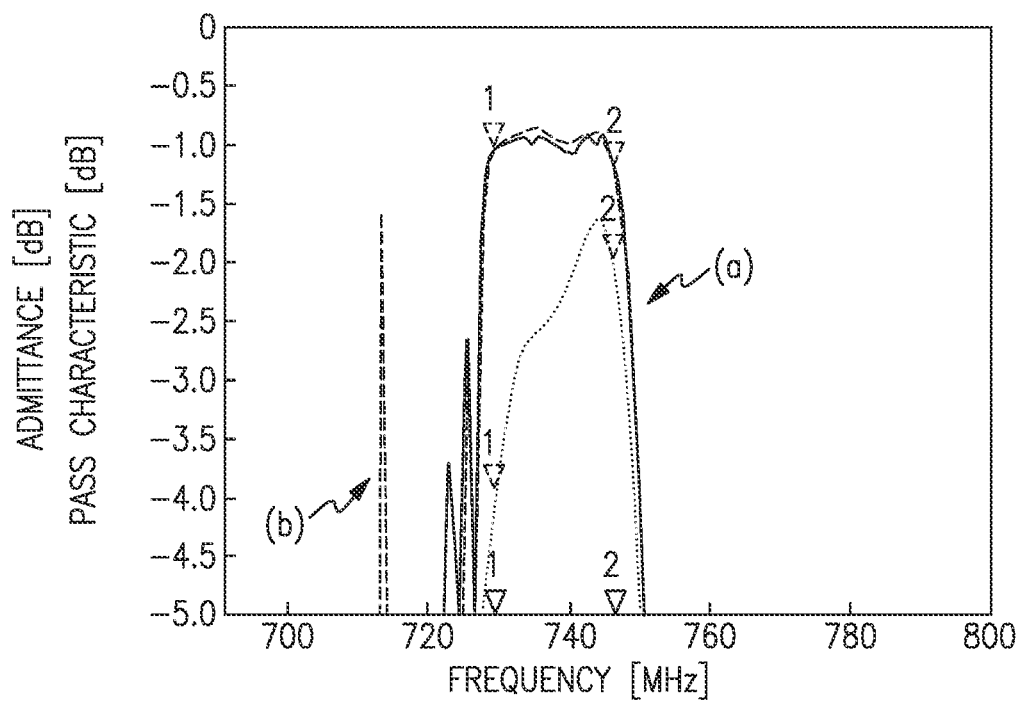
FIG. 8 is a graph vertically enlarging the curves depicted in upper portions of FIG. 7.

FIG. 8 is a graph vertically enlarging the curves depicted in upper portions of FIG. 7. As can be seen in the pass characteristic of the receive filter including the SAW resonator 72 of FIG. 5A indicated by the sold line in curves (a) of FIG. 8, a better pass characteristic having a flat top without ripples can be obtained in the downlink frequency ranging from 729 to 746 MHz of Band 12 according to the LTE standard similar to the case where the ideal matching resonator is provided as indicated by the dashed line. As discussed above, such a better pass characteristic can be achieved by suppressing the spurious responses resulting from a high-order transverse mode occurring in the SAW resonator 101 used as the SAW resonator 72.

Figure 9:
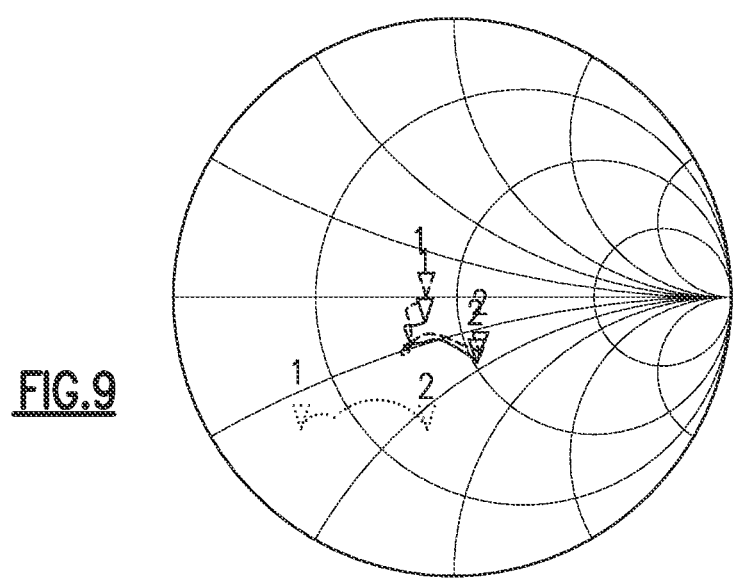
FIG. 9 is a Smith chart illustrating characteristics of the receive filter of FIG. 5A in which a SAW resonator according to an embodiment of the present disclosure is used.

FIG. 9 is a Smith chart illustrating characteristics of the receive filter of FIG. 5A. A solid line depicted in FIG. 9 indicates a pass characteristic of the receive filter illustrated in FIG. 5A by admittance in a frequency band ranging from 729 to 746 MHz. In FIG. 9, a dashed line indicates the case where an ideal matching resonator is provided instead of the SAW resonator 72, and a dotted line indicates the case where there is no resonator provided at the output node.

When there is no resonator at the output node, the imaginary part of the admittance may have a negative value as indicated by the dotted line trajectory in FIG. 9. As indicated by the solid line trajectory in FIG. 9, the imaginary part of the admittance of the receive filter including the SAW resonator 72 has nearly the value of zero, and can be in an area substantially equivalent to that of the case where the ideal matching resonator is provided as indicated by the dashed line in FIG. 9.

Referring back to FIG. 6 that indicates the optimal output impedance value 83 of the receive filter for minimizing the noise figure of the next-stage low noise amplifier in the receive filter and the substantially concentric areas 84 showing that the noise figure ranges from the minimum value to certain stepwise extents, the admittance trajectory indicated by the solid line obtained in the receive filter of FIG. 5A can be found in the areas 84 ranging from the minimum value to certain stepwise extents such that the noise figure of the next-stage low noise amplifier can be ensured to be within a certain range from the minimum value.

Thus, the SAW resonator 101 used as the SAW resonator 72 for the receive filter illustrated in FIG. 5A may be used in the receive filter illustrated in FIG. 5B instead of the series inductor 75. Generally, an inductor may have a greater volume than a SAW resonator and also may have a resistive component. Accordingly, substituting the series inductor 75 with the SAW resonator 72, 101 may reduce the volume corresponding to the inductor and downsize the receive filter and also eliminate the resistive component to reduce the degradation of the noise figure of the next-stage low noise amplifier.

To use the SAW resonator 101 as the SAW resonator 72 for the receive filter of FIG. 5A, the receive filter may be configured to have a filter body including the SAW filter 71 disposed on a rotated Y-cut LiNbO$_3$ substrate with a cut angle of 128 degrees. The SAW resonator 101 may be disposed on a rotated Y-cut LiNbO$_3$ substrate with a cut angle of 5 degrees may be configured as the SAW resonator 72 for the receive filter and externally attached to the output node of the receive filter. Here, the rotated Y-cut LiNbO$_3$ substrate with a cut angle of 128 degrees may be expressed as (0°, 128°-90°, 0°) using the Euler angles ($\varphi$, $\theta$, $\psi$). The SAW filter 71 may not be limited to a ladder filter and may be a longitudinal mode coupling filter.

Although the SAW resonator 101 is configured, in the transverse direction, to have the structures of trenches 13a, which may realize a greater thickness of the SiN film 13 in the center region 55, the structure of mini bus bar electrodes 22 within the mini bus bar electrode regions 57 within the gap regions 52 between tips of the electrode fingers 23 and the bus bar electrodes 21, and the structure of hammer head electrodes 24 allowing the width of the electrode fingers 23 to be partially enlarged, it should be appreciated that the SAW resonator 101 need not be limited to the combination of such structures. For example, the SAW resonator 101 may only include the structure of mini bus bar electrodes 22 without the structures of trenches 13a and hammer head electrodes 24. Further, the SAW resonator 101 may include the structures of mini bus bar electrodes 22 and trenches 13a without the structure of hammer head electrodes 24, or may include the structures of mini bus bar electrodes 22 and hammer head electrodes 24 without the structure of trenches 13a. Even by these structure combinations, the piston mode may be formed in the transverse direction within the center region 55 or the overlapping region 51 and the high-order transverse mode spurious responses can be suppressed.

Figure 10A:
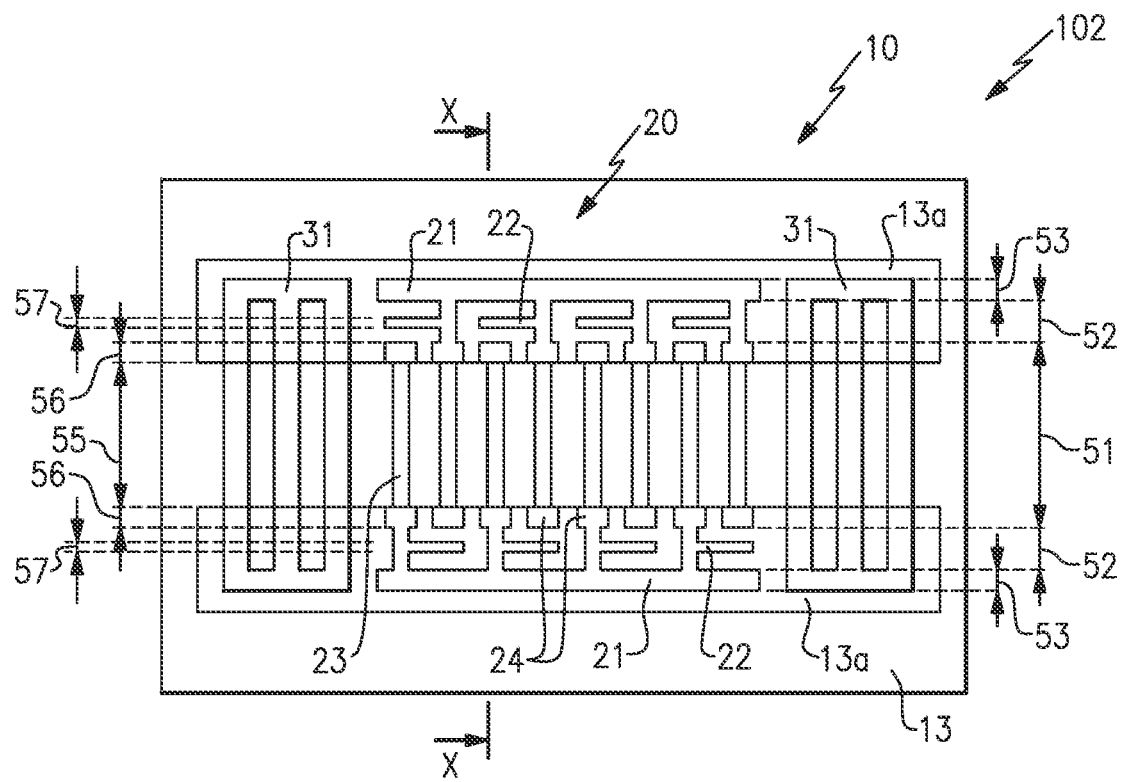
FIG. 10A is a top view illustrating an electrode arrangement in a SAW resonator according to another embodiment of the present disclosure.
Figure 10B:
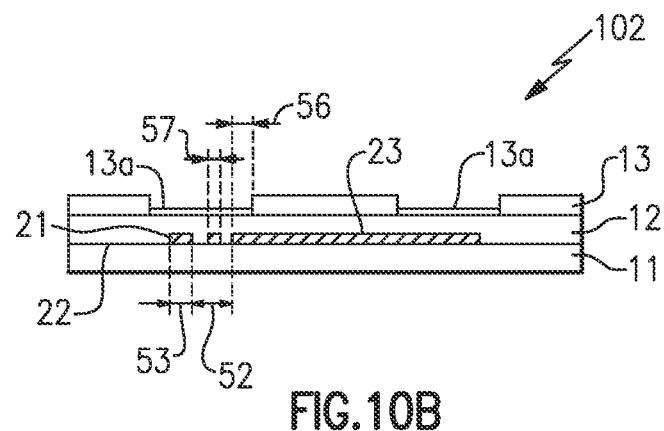
FIG. 10B is a cross sectional view of a SAW resonator according to another embodiment of the present disclosure.

FIG. 10A is a top view illustrating an electrode arrangement in a SAW resonator 102 according to another embodiment and FIG. 10B is a cross sectional view taken along line X-X shown in FIG. 10A. The SAW resonator 102 is different from the SAW resonator 101 only in the structure of the mini bus bar electrodes 22. In FIGS. 10A and 10B, like reference numerals are used to indicate corresponding components of the SAW resonator 101 illustrated in FIGS. 2A and 2B.

The SAW resonator 102 includes a substrate 11 as a piezoelectric substrate having a certain thickness and formed of rotated Y-cut LiNbO$_3$ with a cut angle of 5 degrees, IDT electrodes 20 disposed on an upper surface of the substrate 11 to excite a SAW, and a pair of reflector electrodes 31 disposed thereon to sandwich the IDT electrodes in the propagation direction of the SAW. The IDT electrodes 20 and the reflector electrodes 31 include a heavier element such as molybdenum (Mo) to ensure a desired level of electromechanical coupling with the substrate 11. Aluminum (Al) is deposited on the Mo base to ensure a desired level of electrical conductivity for the IDT electrodes 20. Further, a SiO$_2$ film 12 as a first dielectric film having a certain thickness for temperature compensation is disposed on the upper surface of the substrate 11 and covers the IDT electrodes 20 and the reflector electrodes 31. A SiN film 13 as a second dielectric film having a certain thickness for protection is disposed on an upper surface of the SiO$_2$ film 12.

The heavy metal forming the IDT electrodes 20 may not only include Mo but also copper (Cu), silver (Ag), gold (Au), tungsten (W), tantalum (Ta), and the like. Further, these heavy metals can be combined with Al deposited thereon. In the IDT electrodes 20, the heavy metal as an upper layer may be deposited on Al as a lower layer, or Al as an upper layer may be deposited on the heavy metal as a lower layer.

The rotated Y-cut with a cut angle of 5 degrees for the LiNbO$_3$ substrate 11 can be expressed as (0°, 5°-90°, 0°) using the Euler angles ($\varphi$, $\theta$, $\psi$). The cut angle of the rotated Y-cut LiNbO$_3$ substrate 11 is not limited to being 5 degrees but may alternatively be lower cut angles ranging from −20 to 30 degrees. These lower cut angles may be expressed as (0°, −20°-90° to 30°-90°, 0°) using the Euler angles ($\varphi$, $\theta$, $\psi$).

The IDT electrodes 20 disposed on the upper surface of the substrate 11 include bus bar electrode regions 53 (first bus bar electrode regions), gap regions 52, and an overlapping region 51 in the transverse direction. In the bus bar electrode regions 53 opposing each other, a pair of bus bar electrodes 21 as first bus bar electrodes are formed to be spaced apart from each other by a certain distance. In the overlapping region 51, electrode fingers 23 each having a certain width and alternately extending between one bus bar electrode region 53 and the opposite bus bar electrode region 53 with a certain pitch. Each of the gap regions 52 includes a gap between the bus bar electrode 21 and opposing tips of the electrode fingers 23 extending from the opposite bus bar electrode 21, i.e., between the overlapping region 51 and a respective gap region 52.

In the SAW resonator 102, the SiN film 13 has a greater thickness in a center region 55 within the overlapping region 51 in the transverse direction than in other regions within the overlapping region 51. Specifically, the SiN film 13 disposed on the upper surface of the SiO$_2$ film 12 includes trenches 13a opposing each other in the transverse direction. Each trench 13a is formed by the SiN film 13 being recessed to a certain depth in a portion within the overlapping region 51 excluding the center region 55, in a respective gap regions 52, and in a respective bus bar electrode region 53. The thickness of the SiN film 13 in the center region 55 is greater than the thickness of the SiN film 13 in respective trenches 13a adjacent to the center region 55.

Further, in the SAW resonator 102, the IDT electrodes 20 include second bus bar electrode regions 57 spaced apart from each other in the transverse direction. Each of the second bus bar electrode regions 57 includes a second bus bar electrode 22 formed within a respective gap region 52 in parallel to the first bus bar electrode 21. The second bus bar electrode 22 is formed to have a width less than that of the first bus bar electrode 21. The second bus bar electrode 22 can be referred to as a mini bus bar electrode 22. The mini bus bar electrode 22 is separated into a plurality of segments in the propagation direction of a SAW though the resonator 102. As illustrated in FIG. 10A, each of the segments extends from the right side of a respective electrode finger 23 with respect to the direction of the respective electrode finger 23 extending from a respective bus bar electrode 21. The tip of each segment of the mini bus bar electrode 22 opposes the left side of an adjacent electrode finger 23 with a certain gap. Thus, each of the mini bus bar electrodes 22 does not extend continuously but extends intermittently with a certain pitch parallel to a respective bus bar electrode 21.

Further, in the SAW resonator 102, the IDT electrodes 20 include hammer head electrode regions 56 corresponding to respective tips of the electrode fingers 23 within the overlapping region 51. Each of the hammer head electrode regions 56 includes hammer head electrodes 24, each of which is formed by extending the width of an electrode finger 23 to be shaped like a hammer head across a certain distance extending from the interface of the tip of the electrode finger 23 with a respective gap region 52 to the center region 55 in the transverse direction.

Similar to the SAW resonator 101, the SAW resonator 102 is configured, in the transverse direction, to have the structure of trenches 13a, which may realize a greater thickness of the SiN film 13 in the center region 55, the structure of mini bus bar electrodes 22 in the mini bus bar electrode regions 57 within the gap regions 52, the structure of hammer head electrodes 24 allowing the width of the electrode fingers 23 to be partially enlarged in the hammer head electrode regions 56, and accordingly the phase velocity distribution in the transverse direction may be achieved similar to that of the lower section of FIG. 3. Such a phase velocity distribution in the transverse direction similar to that of the lower section of FIG. 3 can form a piston mode that may allow the oscillation energy to be confined within the center region 55 such that the SAW energy distribution can be substantially constant and piston-like therewithin. This may suppress the occurrence of a high-order transverse mode.

Figure 11A:
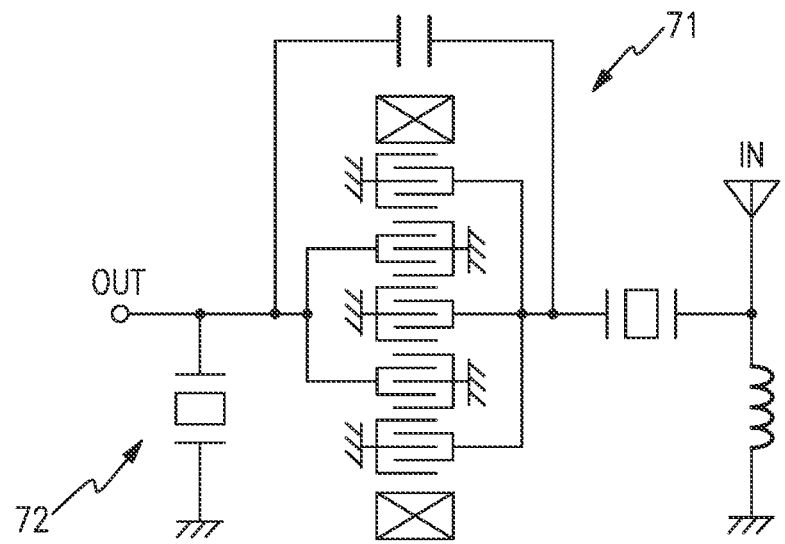
FIG. 11A illustrates a circuit diagram of another receive filter.
Figure 11B:
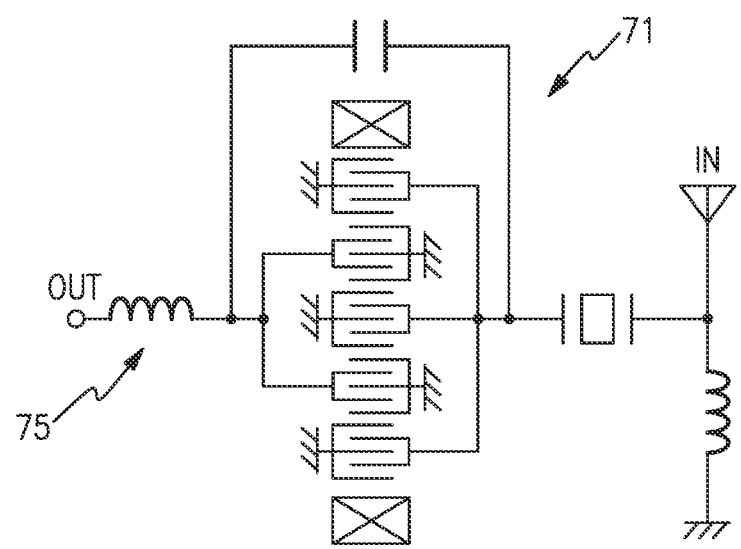
FIG. 11B illustrates a circuit diagram of another receive filter.

FIG. 11A illustrates a circuit diagram of another receive filter to which a SAW resonator 72 is applied at an output node for matching. FIG. 11B illustrates a comparative circuit diagram of another receive filter in which a series inductor 75 is disposed at the output node. These receive filters can be used for the downlink frequency ranging from 746 to 756 MHz of Band 13 according to the LTE standard.

The receive filter illustrated in FIG. 11A includes a ladder SAW filter 71 and the SAW resonator 72 is disposed between the output node and the ground. The receive filter of FIG. 11B is similar to the receive filter of FIG. 11A except that the receive filter of FIG. 11B includes the series inductor 75 between the SAW filter 71 and the output node instead of the SAW resonator 72 included in the receive filter of FIG. 11A.

Although the SAW resonator 72 is applied to the receive filter used for Band 12 of the LTE standard as illustrated in FIG. 5A, the SAW resonator 72 may also be applied to another filter used for Band 13 of the LTE standard similarly in this embodiment. Further, the receive filter for Band 12 of the LTE standard and the other receive filter for Band 13 thereof can be integrated into a package and a SAW resonator for matching the respective receive filters can be integrated into another package such that these packages can be externally connected to each other to configure a receive filter corresponding to Band 12 and Band 13 both.

Although Band 12 and Band 13 of the LTE standard are discussed herein, the frequency band is not limited to these frequency bands and another frequency band may be applied. Further, not only the LTE standard but also another standard may be applied. Still further, although the receive filter is discussed above, the SAW resonator may be applied to a transmit filter for matching at an input node.

First Comparative Example

Figure 12:
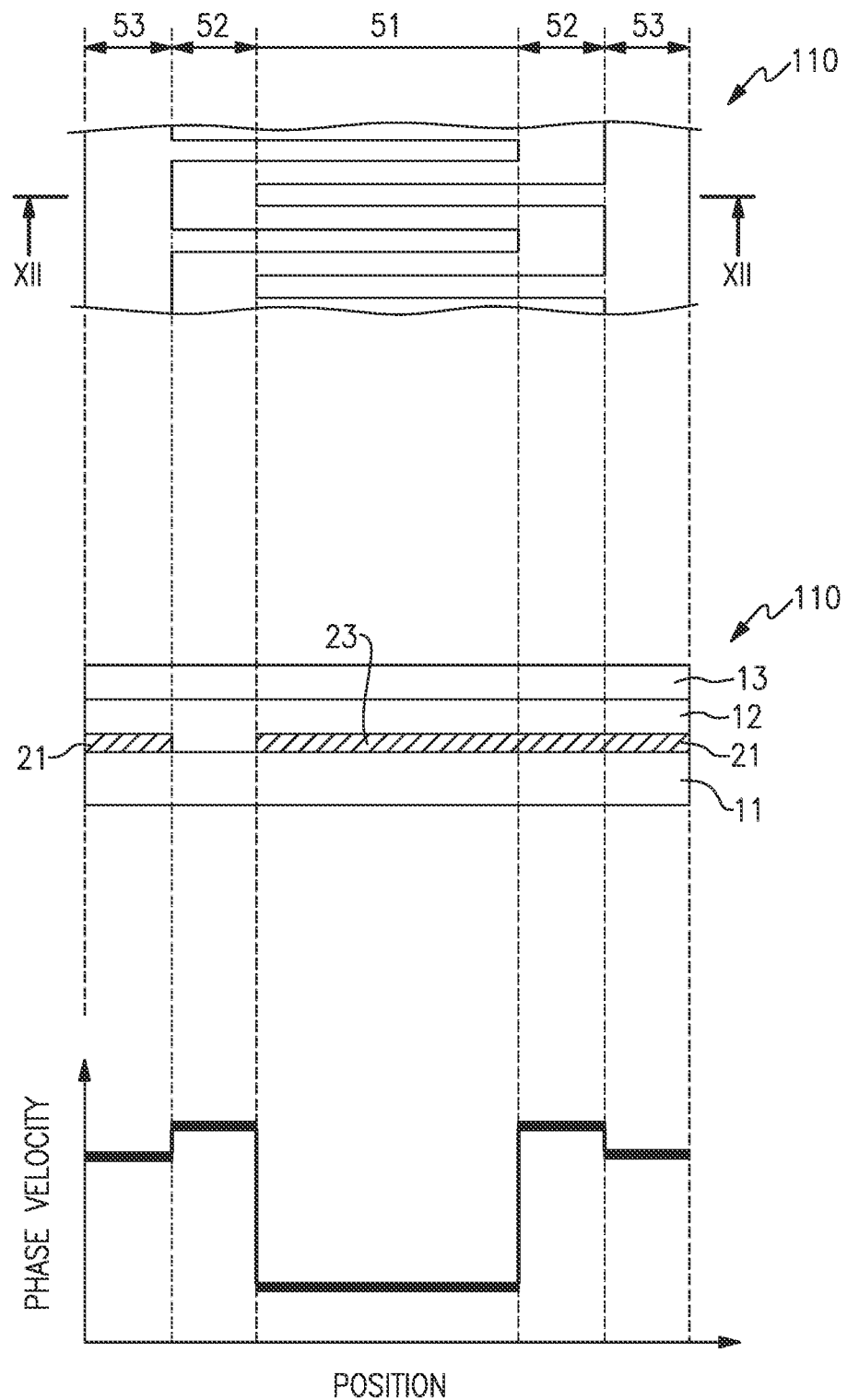
FIG. 12 illustrates a phase velocity distribution in the transverse direction of a first comparative example SAW resonator along with the top view and the cross-sectional view thereof.

The SAW resonator 110 illustrated in FIGS. 1A and 1B will be described as a first comparative example. FIG. 12 illustrates a phase velocity distribution in the transverse direction of a first comparative example SAW resonator 110 along with a top view and the cross-sectional view thereof. The phase velocity distribution illustrated in the lower section of FIG. 12 corresponds to a portion of the upper surface of the SAW resonator 110 illustrated in the upper section of FIG. 12, and also to a cross-section of the SAW resonator 110 illustrated in the middle section of FIG. 12.

The middle section of FIG. 12 illustrates a cross-section taken along line XII-XII in the upper section of FIG. 12.

As illustrated in the lower section of FIG. 12 indicating the transverse direction distribution of the phase velocity, the phase velocity of the overlapping region 51 is lower than the phase velocities of the gap regions 52 and the bus bar electrode regions 53, both of which are disposed laterally outside from the overlapping region 51 in opposite directions, and thus a well-like recess having a bottom at the overlapping region 51 is formed. It may be difficult to form a piston mode that can confine the oscillation energy within the overlapping region 51 such that the SAW energy distribution can be substantially constant and piston-like therewithin with such a transverse direction distribution of the phase velocity. Accordingly, it may be difficult to suppress the occurrence of a high-order transverse mode in the SAW resonator 110.

Figure 13A:
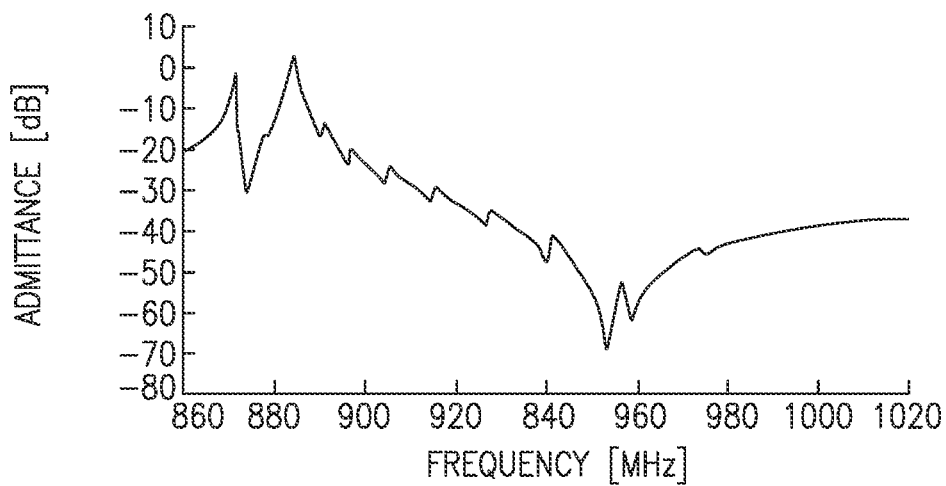
FIG. 13A is a graph illustrating admittance characteristics of the first comparative example SAW resonator.
Figure 13B:
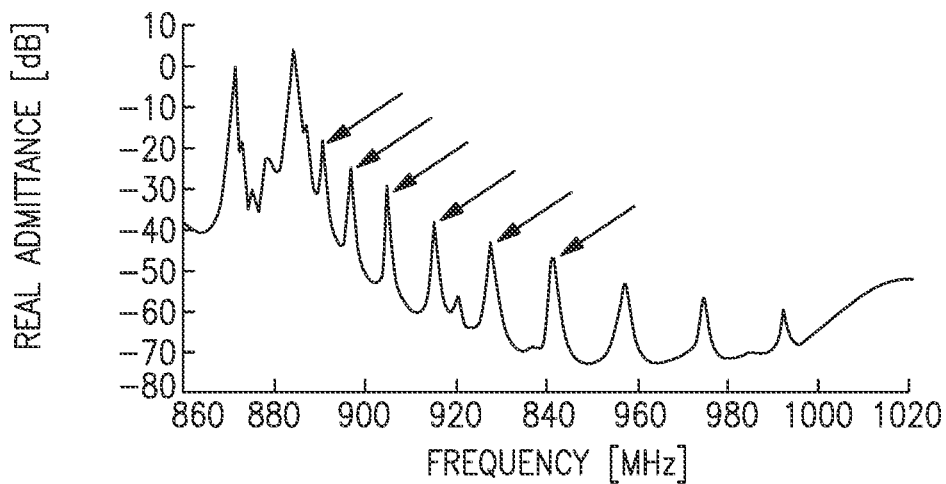
FIG. 13B is a graph illustrating the real part of admittance characteristics of the first comparative example SAW resonator.
Figure 13C:
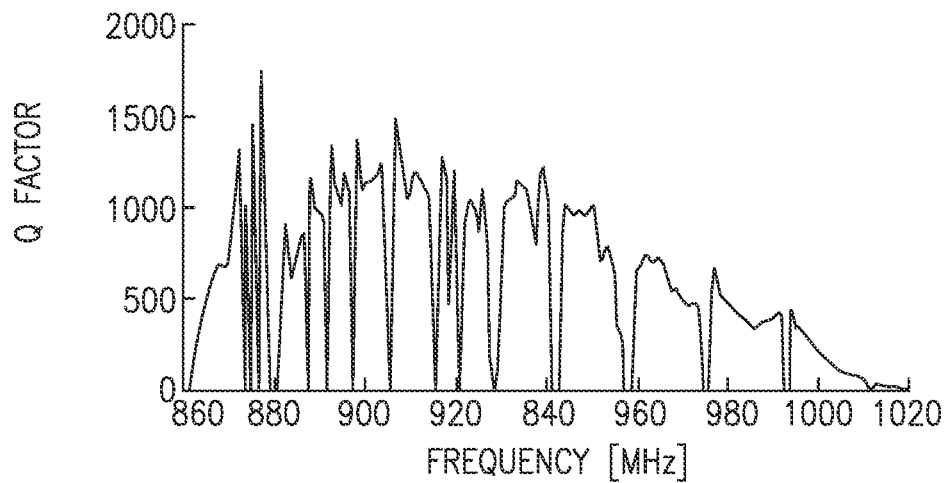
FIG. 13C is a graph illustrating a Q factor of the first comparative example SAW resonator.

FIGS. 13A, 13B, and 13C illustrate curves of the admittance characteristic, the real part of the admittance characteristic, and the quality factor (Q) of the first comparative example SAW resonator 110.

As illustrated in FIG. 13B, some spurious responses indicated by arrows can be found in the real part of the admittance characteristic within a frequency band corresponding to the transition between the resonance and the antiresonance frequencies in the admittance characteristic of FIG. 13A. These spurious responses may be caused by the high-order transverse mode.

Figure 14:
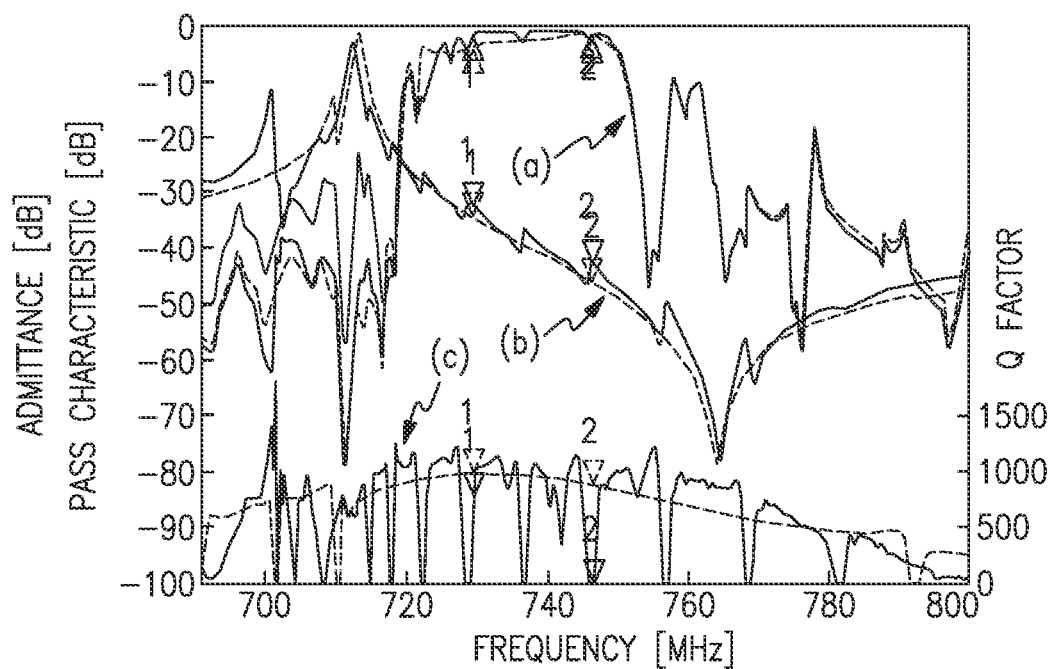
FIG. 14 is a graph illustrating characteristics when the first comparative example SAW resonator is applied to a receive filter.

FIG. 14 is a graph illustrating characteristics of the receive filter including the SAW resonator 72 illustrated in FIG. 5A when the first comparative example SAW resonator 110 illustrated in FIG. 12 is used as the SAW resonator 72.

In FIG. 14, curves (a) indicate pass characteristics of the receive filter in which a solid line indicates the case where the SAW resonator 72 is provided, a dashed line indicates the case where an ideal matching resonator is provided instead of the SAW resonator 72, and a dotted line indicates the case where there is no resonator provided at the output node.

Curves (b) in FIG. 14 include a solid line indicating an admittance characteristic of the SAW resonator 72 and a dashed line indicating an admittance characteristic of an ideal matching resonator. Curves (c) include a solid line indicating a Q factor of the SAW resonator 72 and a dashed line indicating a Q factor of an ideal matching resonator.

Figure 15:
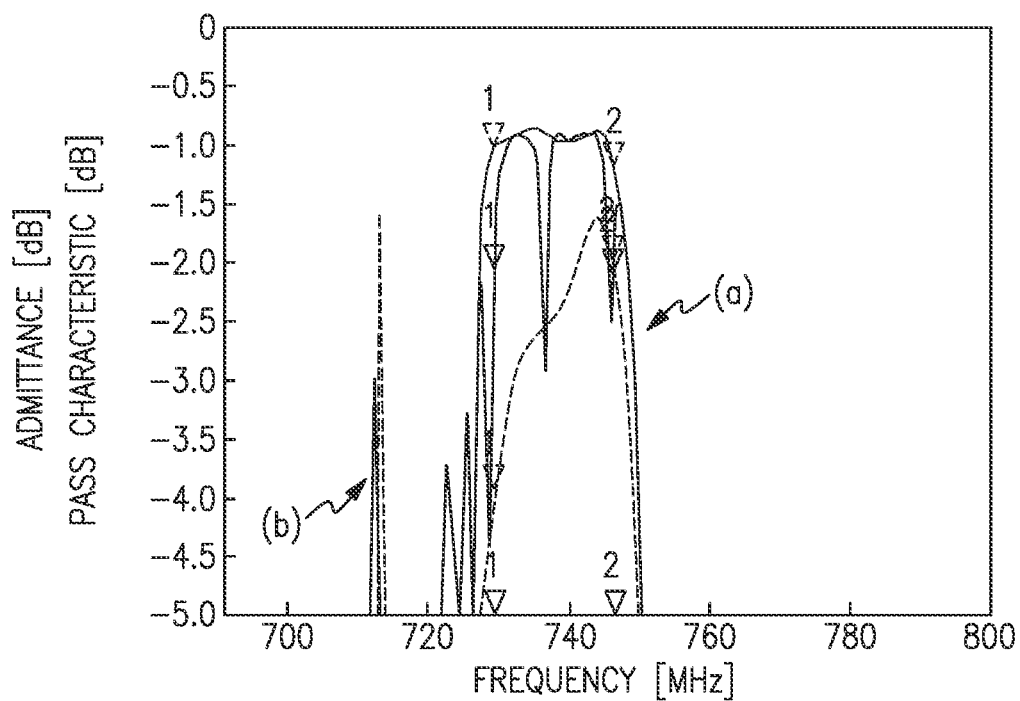
FIG. 15 is a graph vertically enlarging the curves depicted in upper portions of FIG. 14.

FIG. 15 is a graph vertically enlarging the curves depicted in upper portions of FIG. 14. As can be seen in the pass characteristic of the receive filter including the SAW resonator 72 of FIG. 5A indicated by the sold line in curves (a) of FIG. 15, some ripples can be can be found in the downlink frequency ranging from 729 to 746 MHz of Band 12 according to the LTE standard. The pass characteristic of the receive filter including the SAW resonator 72 of FIG. 5A is different from that of the case where the ideal matching resonator is provided as indicated by the dashed line. The pass characteristic degradation with such ripples may result from the occurrence of a high-order transverse mode of the first comparative example SAW resonator 110 used as the SAW resonator 72 as discussed above.

Figure 16:
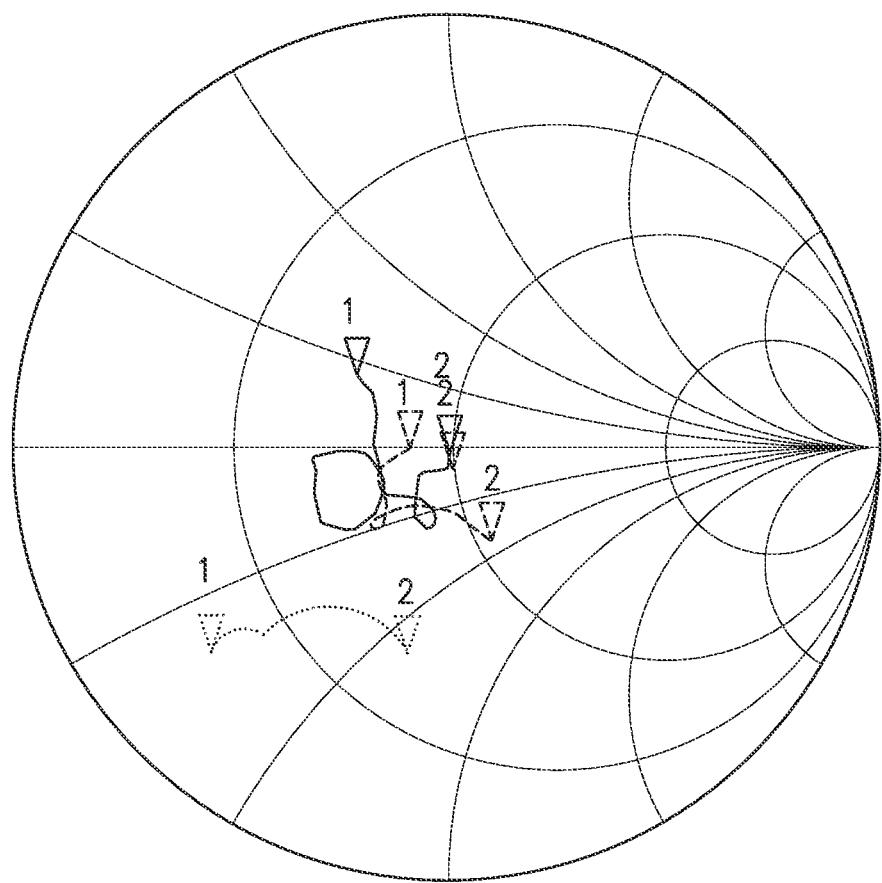
FIG. 16 is a Smith chart illustrating characteristics of a receive filter in which the first comparative example SAW resonator is used.

FIG. 16 is a Smith chart illustrating characteristics of the receive filter of FIG. 5A. A solid line depicted in FIG. 16 indicates a pass characteristic of the receive filter illustrated in FIG. 5A by admittance in a frequency band ranging from 729 to 746 MHz. In FIG. 16, a dashed line indicates the case where an ideal matching resonator is provided instead of the SAW resonator 72, and a dotted line indicates the case where there is no resonator provided at the output node.

When there is no resonator at the output node, the imaginary part of the admittance may have a negative value as indicated by the dotted line trajectory in FIG. 16. As indicated by the solid line trajectory in FIG. 16, the imaginary part of the admittance of the receive filter including the SAW resonator 72 has nearly the value of zero, but can form an area broader than that of the case where the ideal matching resonator is provided as indicated by the dashed line in FIG. 16.

Here, referring to FIG. 6 that indicates the optimal output impedance value 83 of the receive filter for minimizing the noise figure of the next-stage low noise amplifier in the receive filter and the substantially concentric areas 84 showing that the noise figure ranges from the minimum value to certain stepwise extents, the admittance trajectory indicated by the solid line obtained in the receive filter of FIG. 5A may include a portion that would not fall within the areas 84 ranging from the minimum value to certain stepwise extents such that the noise figure of the next-stage low noise amplifier cannot be ensured to be within a certain range from the minimum value.

Second Comparative Example

Figure 1C:
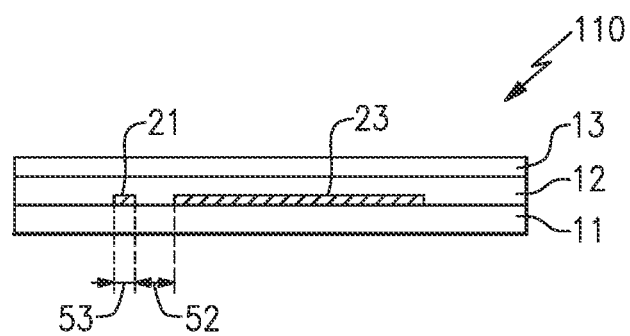
FIG. 1C is a cross-sectional view of another example of a SAW resonator.

The SAW resonator 110 illustrated in FIG. 1C will be described as a second comparative example. The second comparative example SAW resonator 110 illustrated in FIG. 1C is configured by further forming a SiN film 13 on an upper surface of the $SiO_2$ film of the first comparative example SAW resonator 110 illustrated in FIGS. 1A and 1B.

The second comparative example SAW resonator 110 has a phase velocity distribution similar to that of the first comparative example SAW resonator 110 as illustrated in the lower section of FIG. 12. Thus, it may be difficult to form a piston mode and also suppress the occurrence of a high-order transverse mode in the SAW resonator 110.

Figure 17A:
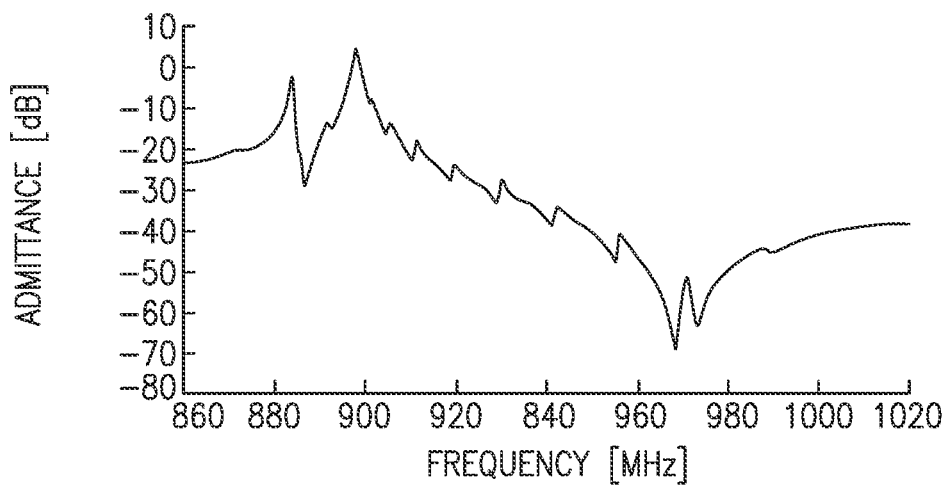
FIG. 17A is a graph illustrating admittance characteristics of a second comparative SAW resonator.
Figure 17B:
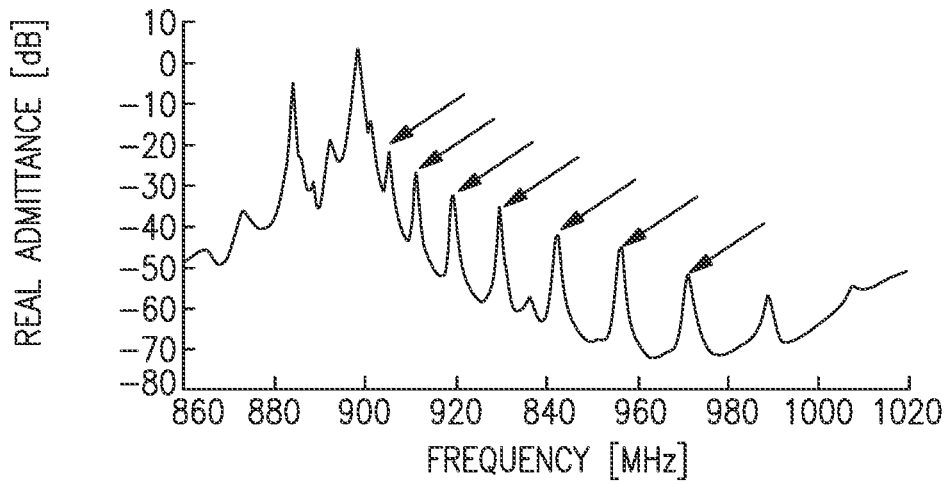
FIG. 17B is a graph illustrating the real part of admittance characteristics of the second comparative SAW resonator.
Figure 17C:
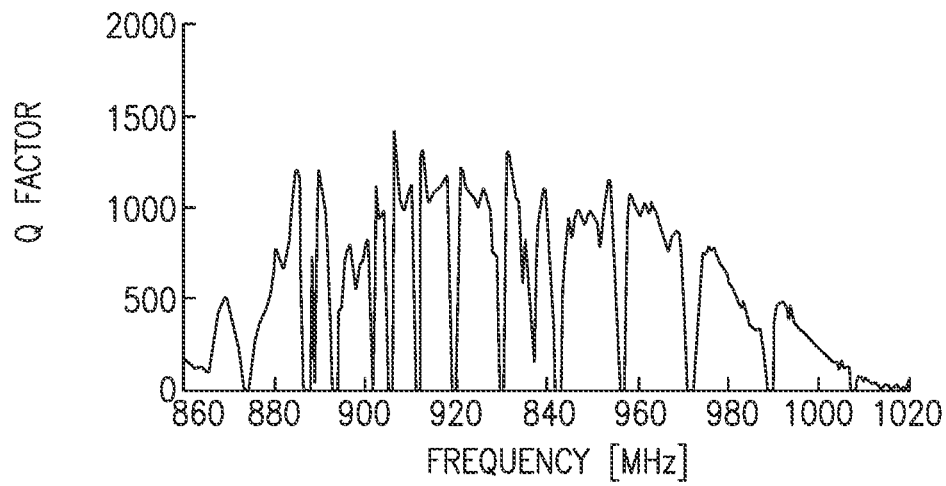
FIG. 17C is a graph illustrating a Q factor of the second comparative SAW resonator.

FIGS. 17A, 17B, and 17C illustrate curves of the admittance characteristic, the real part of the admittance characteristic, and the quality (Q) factor of the second comparative example SAW resonator 110.

As illustrated in FIG. 17B, some spurious responses indicated by arrows can be found in the real part of the admittance characteristic within a frequency band corresponding to the transition between the resonance and the antiresonance frequencies in the admittance characteristic of FIG. 17A. These spurious responses may be caused by the high-order transverse mode.

Radio Frequency Module

Figure 18:
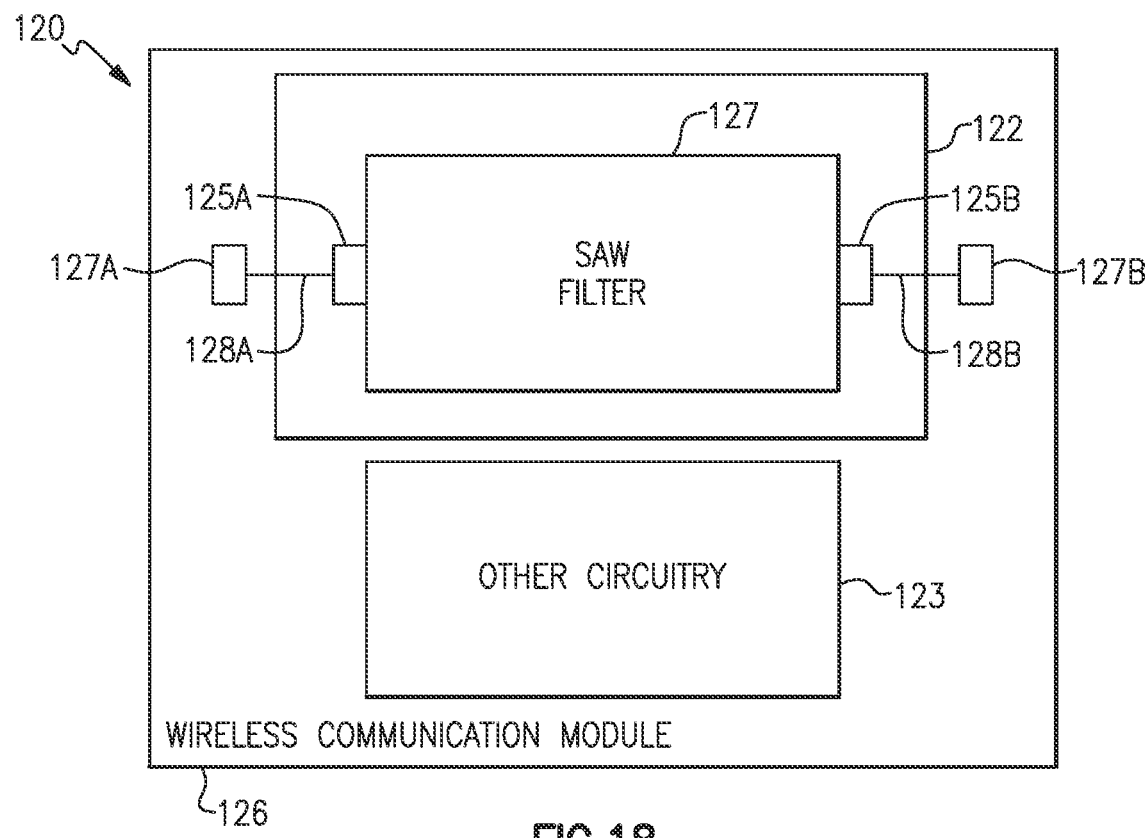
FIG. 18 is a schematic diagram of a radio frequency module that includes a SAW filter according to an embodiment of the present disclosure.

FIG. 18 is a block diagram illustrating a schematic configuration of a radio frequency module 120 that includes a SAW filter 127 including a SAW resonator according to an embodiment disclosed herein. The illustrative radio frequency module 120 includes a SAW component 122 including the SAW resonator and other circuitry 123. The SAW component 122 may include a SAW die including SAW resonators, for example.

The SAW component 122 illustrated in FIG. 18 includes one or more SAW filters 127, and terminals 125A and 125B. The one or more SAW filters 127 include SAW resonators. The terminals 125A and 125B can serve, for example, as an input contact and an output contact. Although two terminals are illustrated, any suitable number of terminals can be implemented for a particular application. The SAW component 122 and the other circuitry 123 are on a common packaging substrate 126 in FIG. 18. The package substrate 126 can be a laminate substrate. The terminals 125A and 125B can be electrically connected to contacts 127A and 127B, respectively, on the packaging substrate 126 by way of electrical connectors 128A and 128B, respectively. The electrical connectors 128A and 128B can be bumps or wire bonds, for example.

The other circuitry 123 can include any suitable additional circuitry. For example, the other circuitry can include one or more power amplifiers, one or more radio frequency switches, one or more additional filters, one or more low noise amplifiers, one or more RF couplers, one or more delay lines, one or more phase shifters or the like, or any suitable combination thereof. The other circuitry 123 is electrically connected to the SAW component 122. The radio frequency module 120 can include one or more packaging structures to, for example, provide protection and/or facilitate easier handling of the radio frequency module 120. Such a packaging structure can include an overmold structure formed over the packaging substrate 126. The overmold structure can encapsulate some or all of the components of the radio frequency module 120.

Front-End Module

Figure 19:
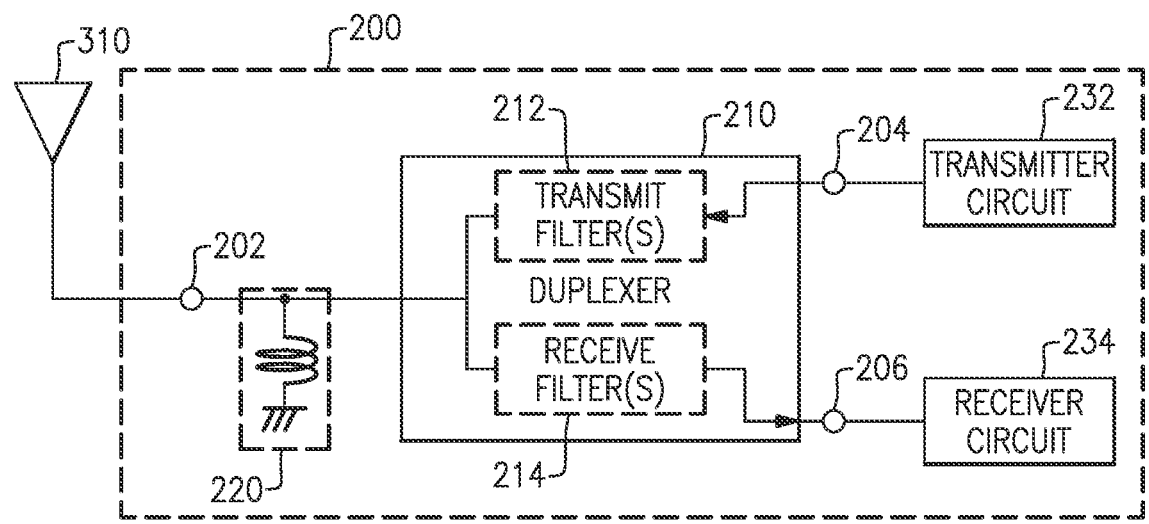
FIG. 19 is a schematic diagram of a front-end module according to an embodiment of the present disclosure.

FIG. 19 is a block diagram illustrating a schematic configuration of one example of front-end module 200, which may be used in a configuration such as a wireless device for mobile communications, for example. The front-end module 200 includes a duplexer 210 having a common node 202, an input node 204 and an output node 206. An antenna 310 is connected to the common node 202. An inductive element 220 may be electrically coupled between the common node 202 and ground.

The duplexer 210 may include one or more transmit filters 212 connected between the input node 204 and the common node 202, and one or more receive filters 214 connected between the common node 202 and the output node 206. The passband(s) of the transmit filter(s) 212 are different from the passband(s) of the receive filter(s) 214. Examples of SAW resonators according to an embodiment disclosed herein can be included in the transmit filter(s) 212 and/or the receive filter(s) 214. For example, the SAW resonators can be used for matching at the input and/or output node in the transmit filter(s) 212 and/or the receive filter(s) 214.

The front-end module 200 further includes a transmitter circuit 232 connected to the input node 204 of the duplexer 210 and a receiver circuit 234 connected to the output node 206 of the duplexer 210. The transmitter circuit 232 can generate signals for transmission via the antenna 310, and the receiver circuit 234 can receive signals via the antenna 310 and process the received signals. In some embodiments, the receiver circuit 234 and the transmitter circuit 232 are separate, as illustrated in FIG. 19; however, in other embodiments, these components may be integrated into a common transceiver circuit or module. As will be appreciated by those skilled in the art, the front-end module 200 may include other components that are not illustrated in FIG. 19 including, but not limited to, switches, electromagnetic couplers, amplifiers, processors, and the like.

Wireless Device

Figure 20:
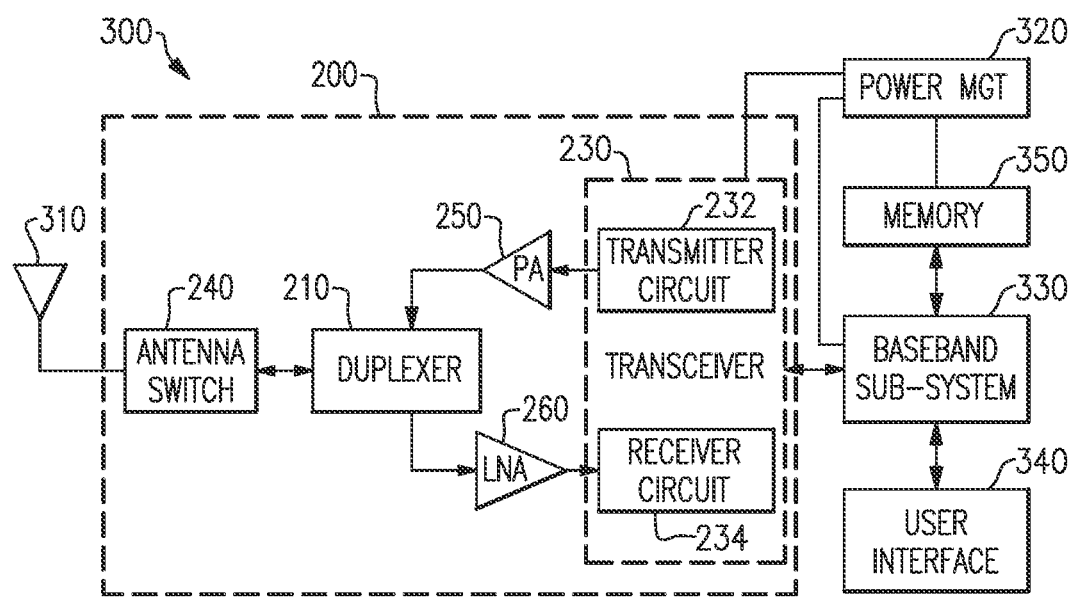
FIG. 20 is a schematic diagram of a wireless device according to an embodiment of the present disclosure.

FIG. 20 is a block diagram illustrating an example configuration of a wireless device 300 that includes the duplexer 210 of FIG. 19. The wireless device 300 can be a cellular phone, smart phone, tablet, modem, communication network or any other portable or non-portable device configured for voice or data communication. The wireless device 300 can receive and transmit signals from the antenna 310. The wireless device 300 may include an embodiment of a front-end module 200 similar to that discussed above with reference to FIG. 19. The front-end module 200 includes the duplexer 210, as discussed above. In the example illustrated in FIG. 20, the front-end module 200 further includes an antenna switch 240, which can be configured to switch between different frequency bands or modes, such as transmit and receive modes, for example. In the example illustrated in FIG. 20, the antenna switch 240 is positioned between the duplexer 210 and the antenna 310; however, in other examples, the duplexer 210 can be positioned between the antenna switch 240 and the antenna 310. In other examples, the antenna switch 240 and the duplexer 210 can be integrated into a single component.

The front-end module 200 includes a transceiver 230 that is configured to generate signals for transmission or to process received signals. The transceiver 230 can include the transmitter circuit 232, which can be connected to the input node 204 of the duplexer 210, and the receiver circuit 234, which can be connected to the output node 206 of the duplexer 210, as illustrated in the example of FIG. 20.

Signals generated for transmission by the transmitter circuit 232 are received by a power amplifier (PA) module 250, which amplifies the generated signals from the transceiver 230. The power amplifier module 250 can include one or more power amplifiers. The power amplifier module 250 can be used to amplify a wide variety of radio frequency (RF) or other frequency-band transmission signals. For example, the power amplifier module 250 can receive an enable signal that can be used to pulse the output of the power amplifier to aid in transmitting a wireless local area network (WLAN) signal or any other suitable pulsed signal. The power amplifier module 250 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 250 and associated components including switches and the like can be fabricated on gallium arsenide (GaAs) substrates using, for example, high-electron mobility transistors (pHEMT) or insulated-gate bipolar transistors (BiFET), or on a silicon substrate using complementary metal-oxide semiconductor (CMOS) field effect transistors.

Still referring to FIG. 20, the front-end module 200 may further include a low noise amplifier (LNA) module 260, which amplifies received signals from the antenna 310 and provides the amplified signals to the receiver circuit 234 of the transceiver 230.

The wireless device 300 of FIG. 20 further includes a power management (MGT) sub-system 320 that is connected to the transceiver 230 and manages the power for the operation of the wireless device 300. The power management system 320 can also control the operation of a baseband sub-system 330 and various other component of the wireless device 300. The power management system 320 can include, or can be connected to, a battery (not shown) that supplies power for the various components of the wireless device 300. The power management system 320 can further include one or more processors or controllers that can control the transmission of signals, for example. In one embodiment, the baseband sub-system 330 is connected to a user interface 340 to facilitate various input and output of voice and/or data provided to and received from the user. The baseband sub-system 330 can also be connected to memory 350 that is configured to store data and/or instructions to facilitate the operation of the wireless device, and/or to provide storage of information for the user. Any of the principles and advantages discussed herein can be implemented in association with RF circuits configured to process signals in a range from about 30 kHz to 300 GHz.

Aspects of this disclosure can be implemented in various electronic devices. Examples of the electronic devices can include, but are not limited to, consumer electronic products, parts of the consumer electronic products such as chips and/or packaged radio frequency modules, electronic test equipment, uplink wireless communication devices, personal area network communication devices, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a vehicular electronics system such as an automotive electronics system, a microwave, a refrigerator, a stereo system, a digital music player, a camera such as a digital camera, a portable memory chip, a household appliance, etc. Further, the electronic devices can include unfinished products.

Conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application.

While certain embodiments have been described, these embodiments have been presented by way of example only and are not intended to limit the scope of the disclosure. Indeed, the novel devices, chips, methods, apparatus, and systems described herein may be embodied in a variety of other forms. Furthermore, various omissions, substitutions and changes in the form of the methods, apparatus, and systems described herein may be made without departing from the spirit of the disclosure. For example, circuit blocks described herein may be deleted, moved, added, subdivided, combined, and/or modified. Each of these circuit blocks may be implemented in a variety of different ways. The accompanying claims and their equivalents are intended to cover any such forms or modifications as would fall within the scope and spirit of the disclosure.

What is claimed is:

1. A surface acoustic wave resonator comprising:
   a piezoelectric substrate;
   interdigital transducer electrodes disposed on an upper surface of the piezoelectric substrate, the interdigital transducer electrodes including first bus bar electrode regions spaced apart from each other in a transverse direction perpendicular to a propagation direction of a surface acoustic wave to be excited, an overlapping region sandwiched between the first bus bar electrode regions, and gap regions defined between the respective first bus bar electrode regions and the overlapping region in the transverse direction, the interdigital transducer electrodes including first bus bar electrodes disposed within each of the first bus bar electrode regions, and electrode fingers extending from each of the first bus bar electrodes, the electrode fingers extending from one bus bar electrode being interleaved with the electrode fingers extending from the other first bus bar electrode within the overlapping region;
   a second bus bar electrode disposed in parallel to a respective first bus bar electrode within each of the gap regions, each of the second bus bar electrodes extending intermittently and formed from conductive traces extending from only single sides of the electrode fingers;
   a first dielectric film covering the interdigital transducer electrodes and the upper surface of the piezoelectric substrate for temperature compensation; and
   a second dielectric film covering the first dielectric film.

2. The surface acoustic wave resonator of claim 1 wherein the first dielectric film is formed of $SiO_2$.

3. The surface acoustic wave resonator of claim 2 wherein the second dielectric film is formed of SiN.

4. The surface acoustic wave resonator of claim 3 further comprising an intermediate layer formed of silicon oxynitride disposed between the first dielectric film and the second dielectric film.

5. The surface acoustic wave resonator of claim 1 wherein the piezoelectric substrate is formed of a rotated Y-cut lithium niobate with a cut angle ranging from −20 to 30 degrees.

6. The surface acoustic wave resonator of claim 1 wherein the interdigital transducer electrodes include molybdenum.

7. The surface acoustic wave resonator of claim 6 wherein the interdigital transducer electrodes include aluminum deposited on molybdenum.

8. The surface acoustic wave resonator of claim 1 wherein the second bus bar electrodes extend form a first side of the electrode fingers extending from the one of the first bus bar electrodes and from a second side of the electrode fingers extending from the other of the first bus bar electrodes, the first side being opposite the second side.

9. The surface acoustic wave resonator of claim 8 wherein the second bus bar electrode extending from the first side of the electrode fingers extending from the one of the first bus bar electrodes extend into regions aligned in the transverse direction with electrode fingers extending from the other of the first bus bar electrodes.

10. The surface acoustic wave resonator of claim 1 further comprising a hammer head electrode formed across a certain distance from a respective gap region in the transverse direction by extending a width of an electrode finger within the overlapping region in the propagation direction.

11. The surface acoustic wave resonator of claim 10 wherein the second dielectric film includes a trench having portions corresponding to the gap region, the hammer head electrode, and a respective first bus bar electrode region thinner than a portion corresponding to the overlapping region.

12. A filter including a surface acoustic wave resonator comprising:
    a piezoelectric substrate;
    interdigital transducer electrodes disposed on an upper surface of the piezoelectric substrate, the interdigital transducer electrodes including first bus bar electrode regions spaced apart from each other in a transverse direction perpendicular to a propagation direction of a surface acoustic wave to be excited, an overlapping region sandwiched between the first bus bar electrode regions, and gap regions defined between the respective first bus bar electrode regions and the overlapping region in the transverse direction, each of the gap regions including a second bus bar electrode disposed in parallel to a respective first bus bar electrode;

reflector electrodes disposed on opposite sides of the interdigital transducer electrodes and displaced from the interdigital transducer electrodes in the propagation direction of the surface acoustic wave to be excited;

a first dielectric film covering the interdigital transducer electrodes and the upper surface of the piezoelectric substrate for temperature compensation; and a second dielectric film covering the first dielectric film, the second dielectric film including a trench having portions defined within the gap regions, within the first bus bar electrode regions, and over portions of the reflector electrodes.

13. The filter of claim 12 wherein the surface acoustic wave resonator is disposed between an output node and a ground for matching.

14. The filter of claim 12 wherein the filter is a ladder filter.

15. The filter of claim 12 wherein the filter is a longitudinal mode filter.

16. The filter of claim 12 further comprising a hammer head electrode formed across a certain distance from a respective gap region in the transverse direction by extending a width of an electrode finger within the overlapping region in the propagation direction.

17. The filter of claim 12 wherein the second bus bar electrode extends intermittently.

18. The filter of claim 12 wherein the interdigital transducer electrodes include first bus bars disposed within each of the first bus bar electrode regions, and electrode fingers extending from each of the first bus bars, the electrode fingers extending from one bus bar electrode being interleaved with the electrode fingers extending from the other first bus bar electrode within the overlapping region, each of the second bus bar electrodes extending intermittently and formed from conductive traces extending from only single sides of the electrode fingers.

19. A wireless device that communicates by a frequency division bidirectional communication at a radio frequency, the wireless device having a duplexer with a transmit filter and a receive filter, at least one of the transmit filter and the receive filter including a surface acoustic wave resonator comprising:

a piezoelectric substrate;

interdigital transducer electrodes disposed on an upper surface of the piezoelectric substrate, the interdigital transducer electrodes including first bus bar electrode regions spaced apart from each other in a transverse direction perpendicular to a propagation direction of a surface acoustic wave to be excited, an overlapping region sandwiched between the first bus bar electrode regions, and gap regions defined between the respective first bus bar electrode regions and the overlapping region in the transverse direction, each of the gap regions including a second bus bar electrode disposed in parallel to a respective first bus bar electrode;

a first dielectric film covering the interdigital transducer electrodes and the upper surface of the piezoelectric substrate for temperature compensation; and a second dielectric film covering the first dielectric film, the second dielectric film including a trench having portions defined within the gap regions, within the first bus bar electrode regions, and within regions on opposite sides of the first bus bar electrode regions from the overlapping region.

20. The wireless device of claim 19 wherein the interdigital transducer electrodes include first bus bars disposed within each of the first bus bar electrode regions, and electrode fingers extending from each of the first bus bars, the electrode fingers extending from one bus bar electrode being interleaved with the electrode fingers extending from the other first bus bar electrode within the overlapping region, each of the second bus bar electrodes extending intermittently and formed from conductive traces extending from only single sides of the electrode fingers.

\* \* \* \* \*

UNITED STATES PATENT AND TRADEMARK OFFICE
CERTIFICATE OF CORRECTION

PATENT NO. : 11,870,421 B2
APPLICATION NO. : 17/076945
DATED : January 9, 2024
INVENTOR(S) : Yuya Hiramatsu et al.

Page 1 of 1

It is certified that error appears in the above-identified patent and that said Letters Patent is hereby corrected as shown below:

In the Claims

Column 18, Line 33, Claim number 8, delete "form" and insert -- from --.

Signed and Sealed this
Thirteenth Day of February, 2024

Katherine Kelly Vidal
*Director of the United States Patent and Trademark Office*